(12) United States Patent
Kiyotoshi

(10) Patent No.: US 8,779,499 B2
(45) Date of Patent: Jul. 15, 2014

(54) NONVOLATILE SEMICONDUCTOR MEMORY DEVICE AND METHOD OF MANUFACTURING THE SAME

(75) Inventor: Masahiro Kiyotoshi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 301 days.

(21) Appl. No.: 13/352,693

(22) Filed: Jan. 18, 2012

(65) Prior Publication Data
US 2012/0267699 A1   Oct. 25, 2012

(30) Foreign Application Priority Data

Apr. 19, 2011   (JP) .................. 2011-092978

(51) Int. Cl.
*H01L 29/788*   (2006.01)

(52) U.S. Cl.
USPC ............ 257/319; 257/E27.103; 257/E21.645; 438/137; 438/138; 438/156; 438/264

(58) Field of Classification Search
None
See application file for complete search history.

(56) References Cited

U.S. PATENT DOCUMENTS

| | | |
|---|---|---|
| 2008/0186771 A1 | 8/2008 | Katsumata et al. |
| 2010/0003795 A1 | 1/2010 | Park et al. |
| 2010/0181612 A1* | 7/2010 | Kito et al. ............ 257/319 |

FOREIGN PATENT DOCUMENTS

JP   2008-192708   8/2008

OTHER PUBLICATIONS

SungJin Whang et al., "Novel 3-Dimensional Dual Control-Gate with Surrounding Floating-Gate (DC-SF) NAND Flash Cell for 1Tb File Storage Application", 2010 International Electron Device Meeting IEDM 2010 Proceedings. 2010. pp. 666-671.
U.S. Appl. No. 13/218,868, filed Aug. 26, 2011, Masahiro Kiyotoshi.

* cited by examiner

*Primary Examiner* — Yasser A Abdelaziez
(74) *Attorney, Agent, or Firm* — Oblon, Spivak, McClelland, Maier & Neustadt, L.L.P.

(57) ABSTRACT

According to one embodiment, a nonvolatile semiconductor memory device includes sheet-like memory strings arranged in a matrix shape substantially perpendicularly to a substrate. A control gate electrode film includes a common connecting section that extends in a first direction and an electrode forming section that is provided for each of memory cells above or below a floating gate electrode film via an inter-electrode dielectric film to project from the common connecting section in a second direction. The floating gate electrode film extends in the second direction and is formed on a first principal plane of a sheet-like semiconductor film via a tunnel dielectric film.

4 Claims, 25 Drawing Sheets

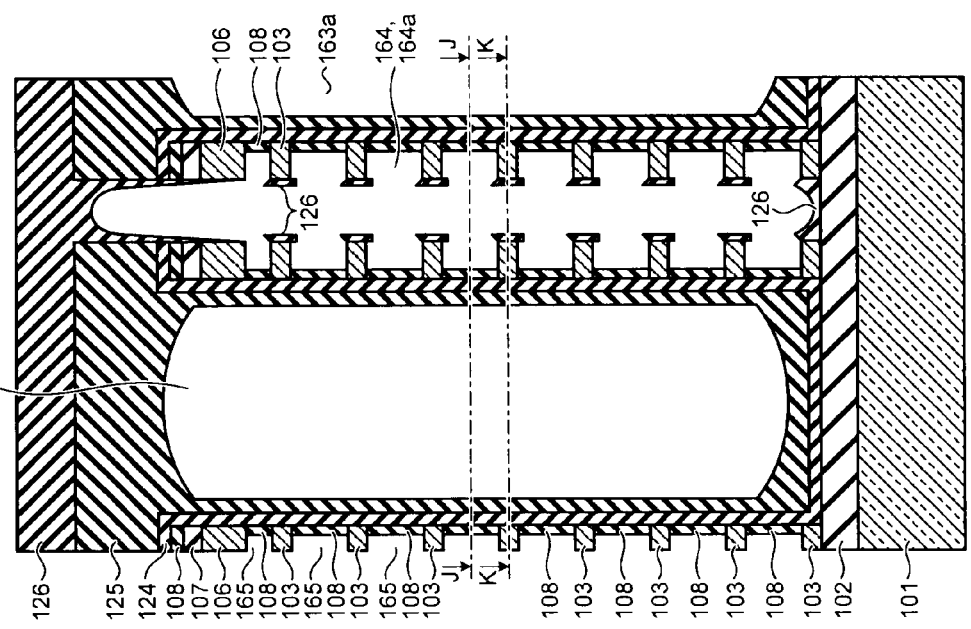

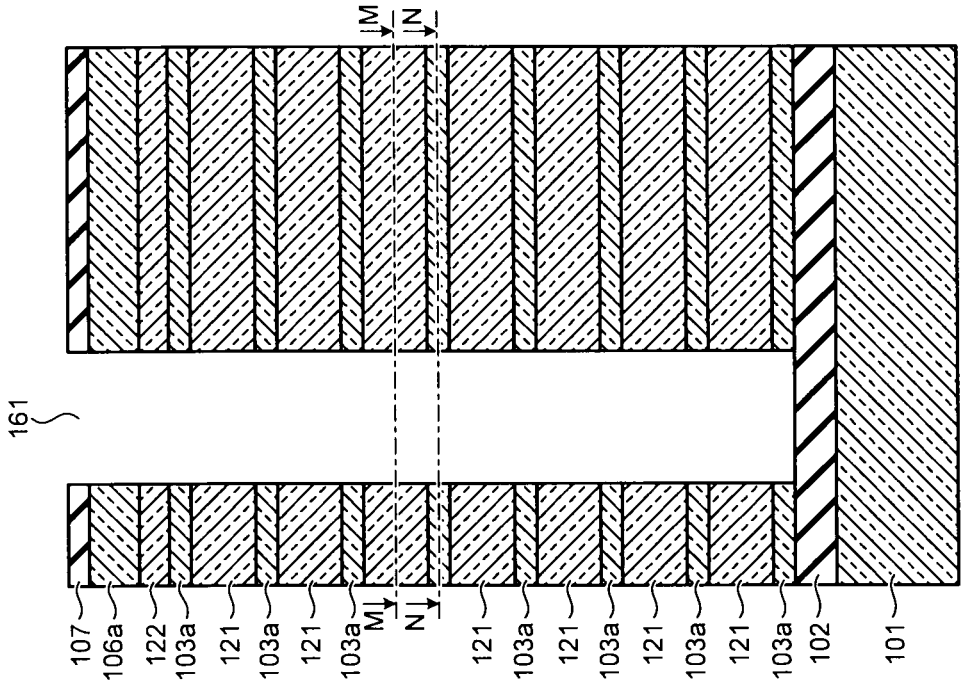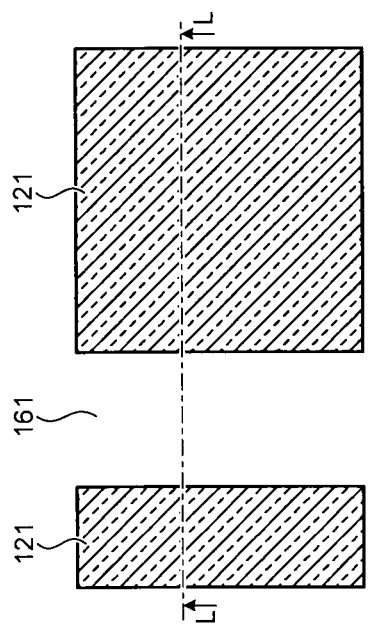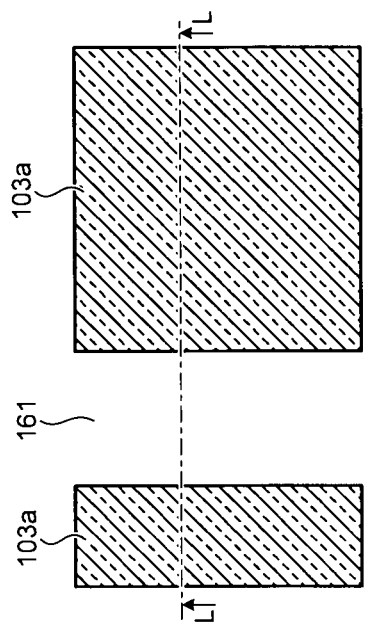

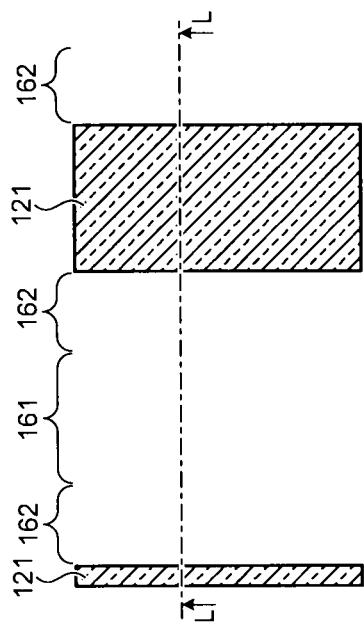
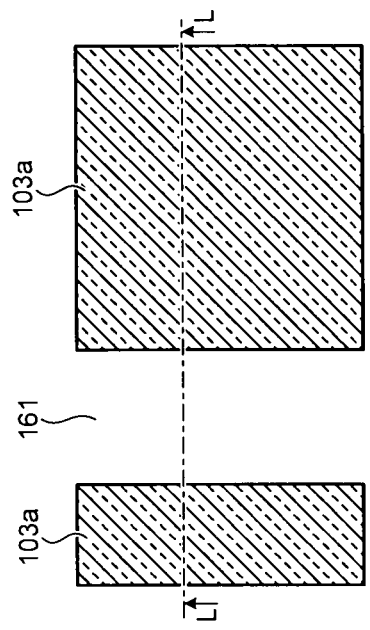
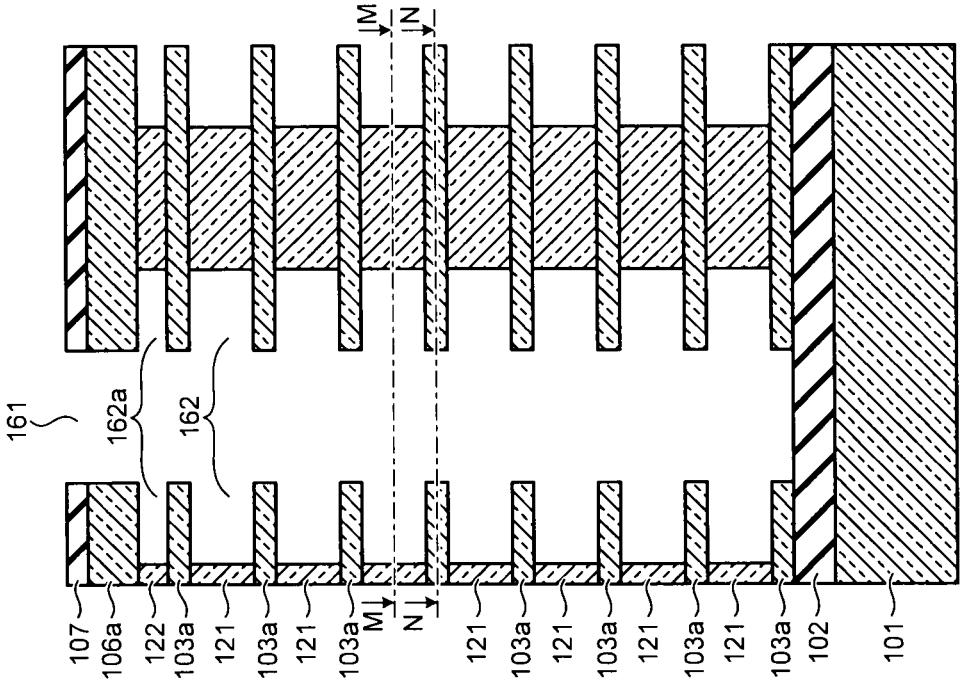

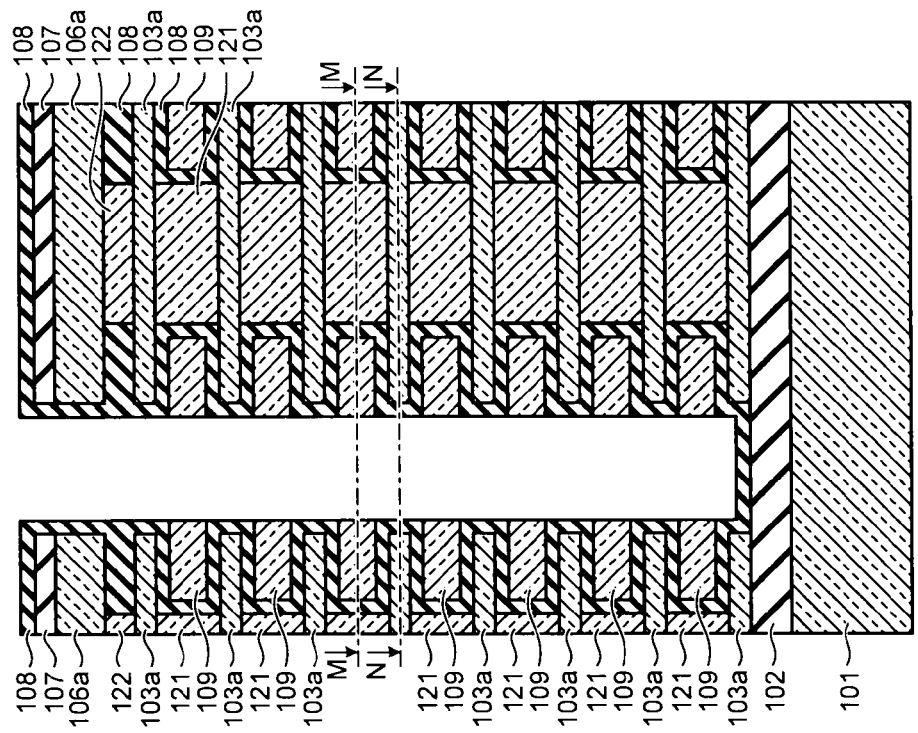
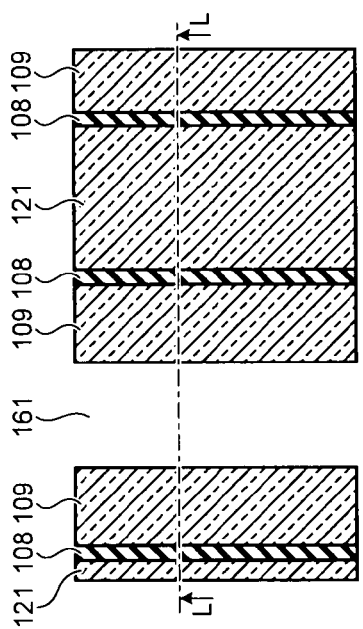
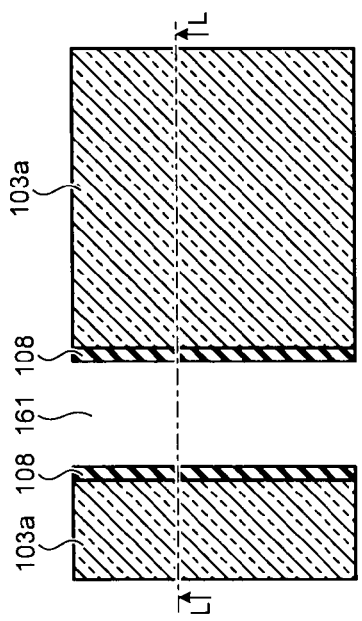

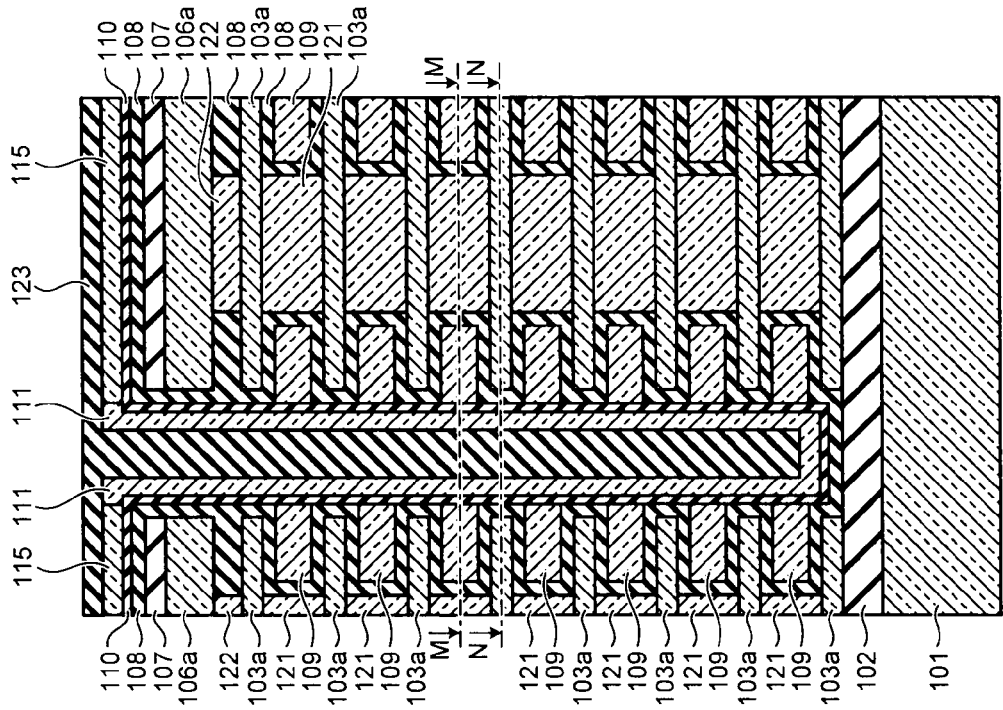
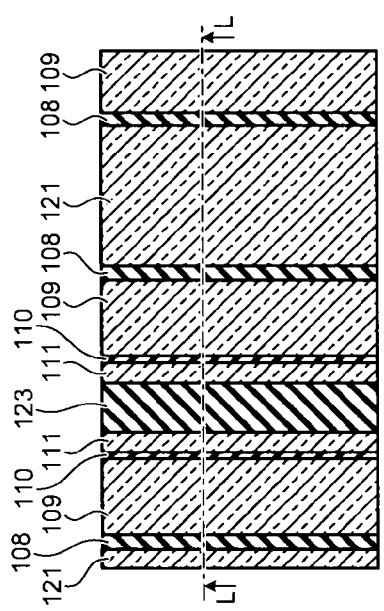
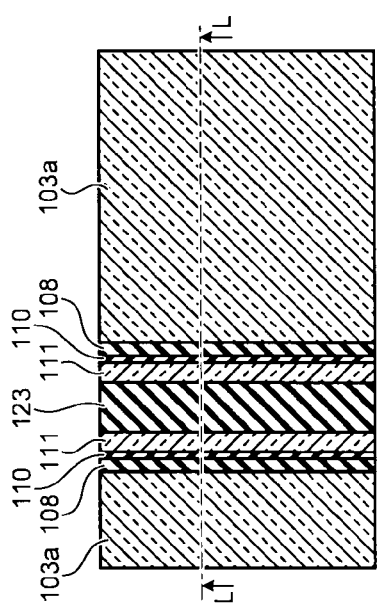

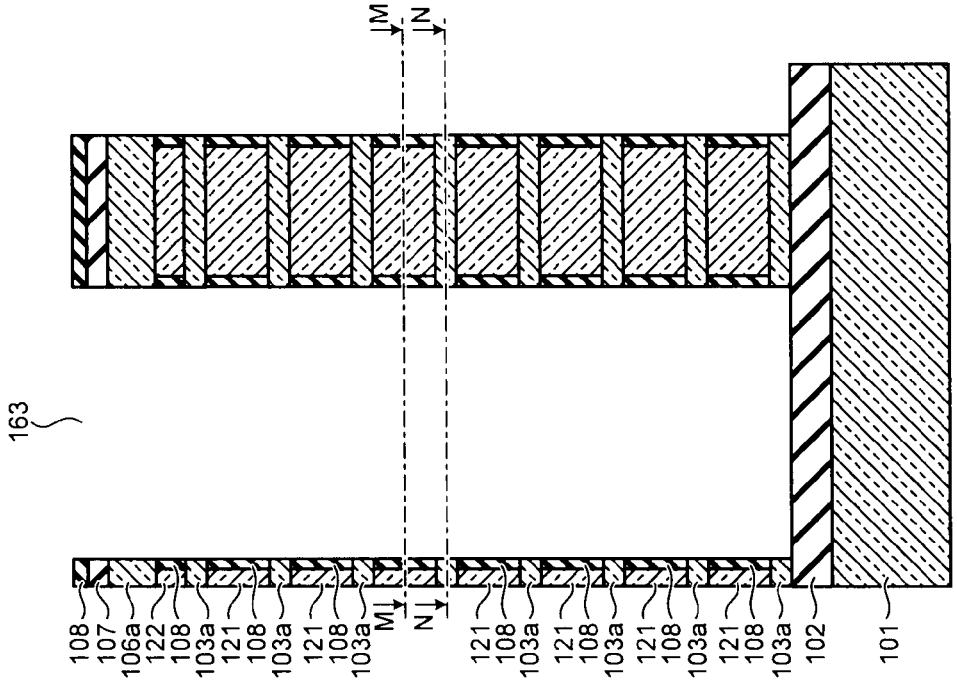
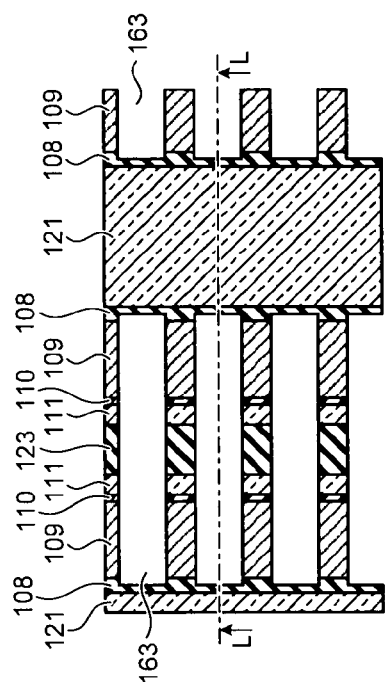
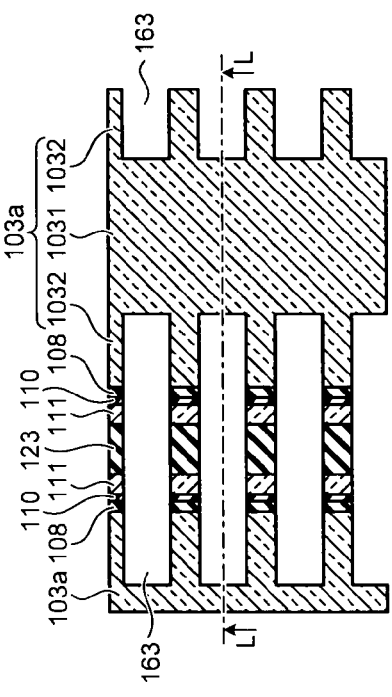

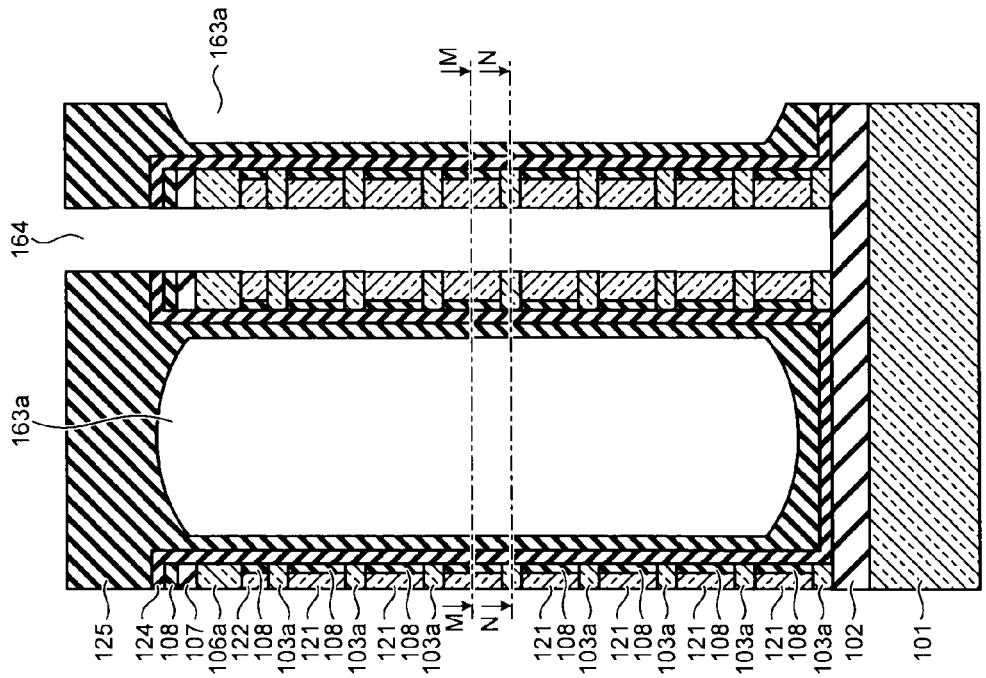
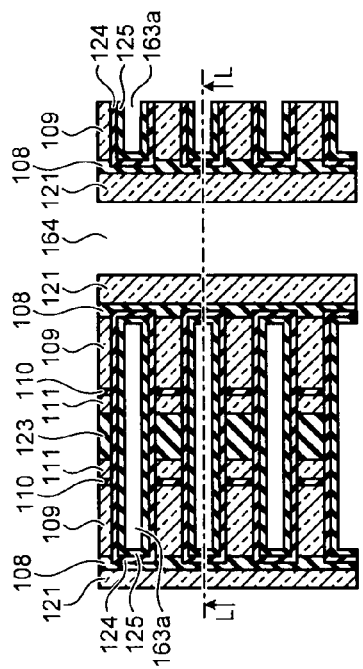
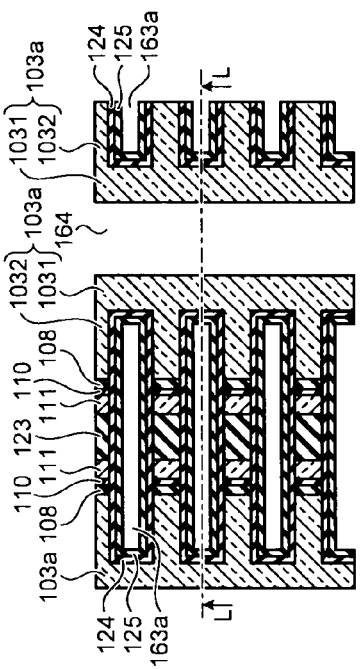

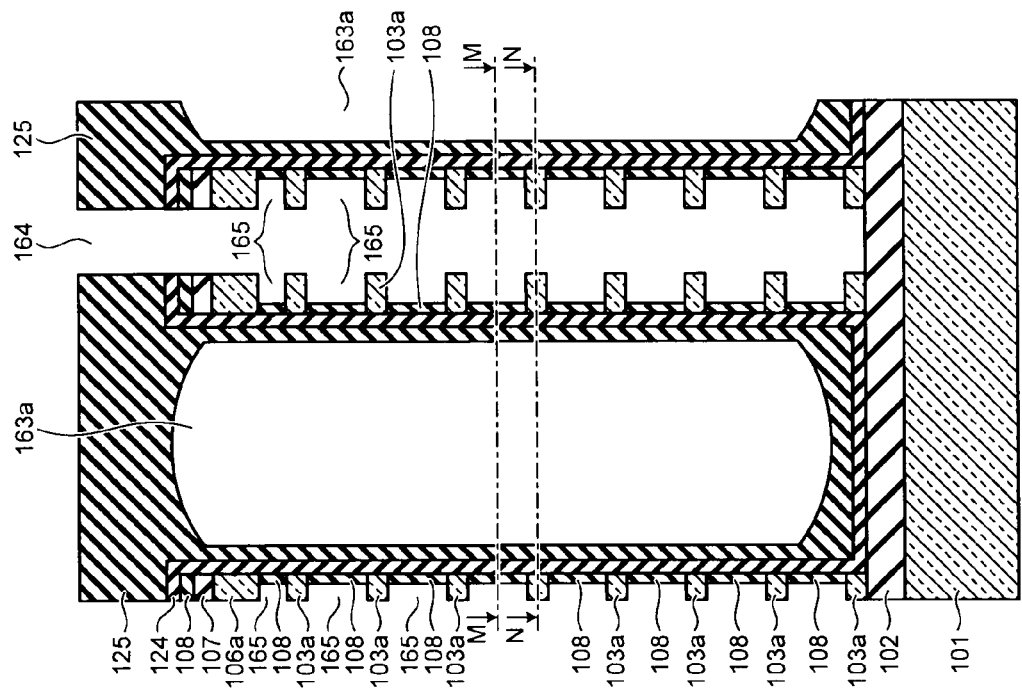
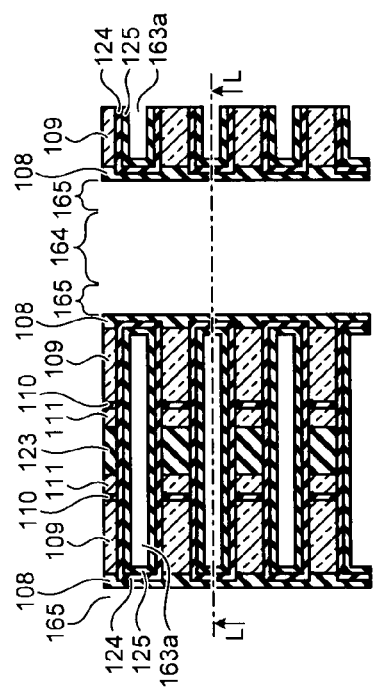
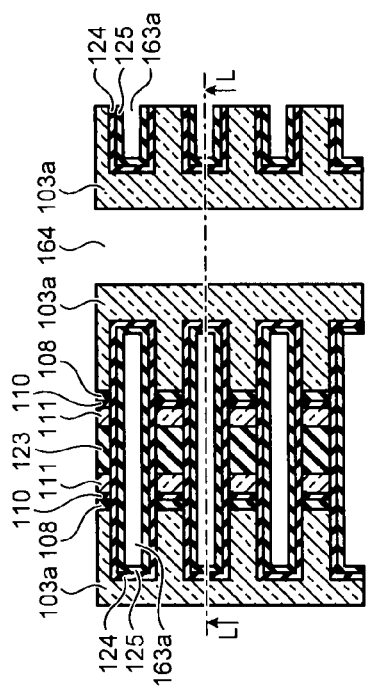

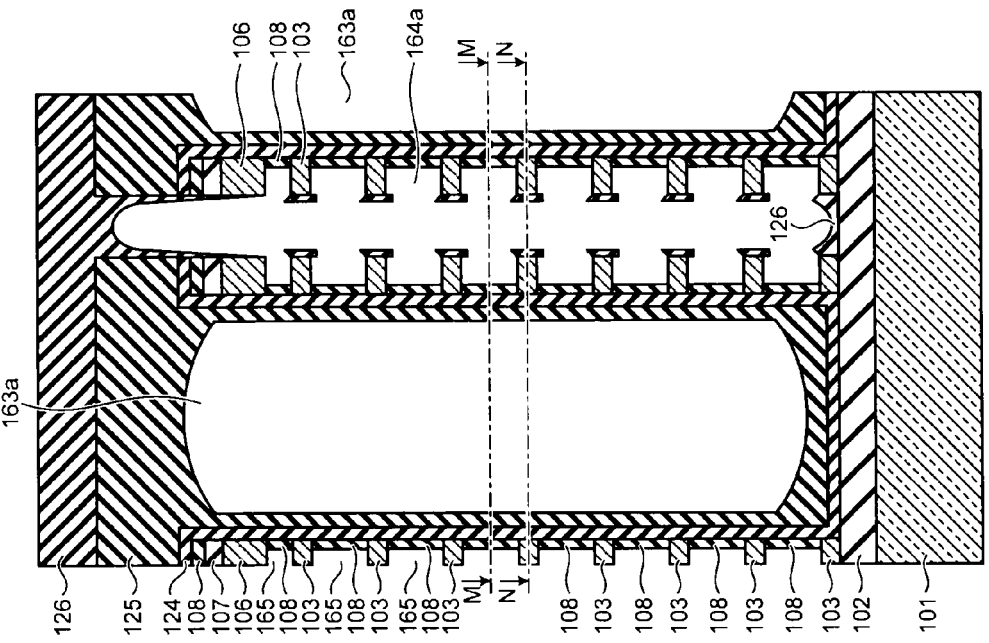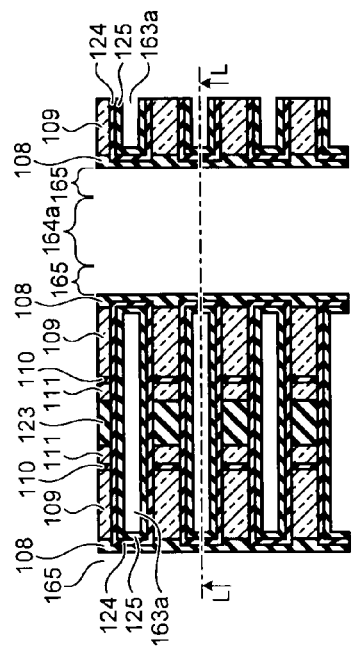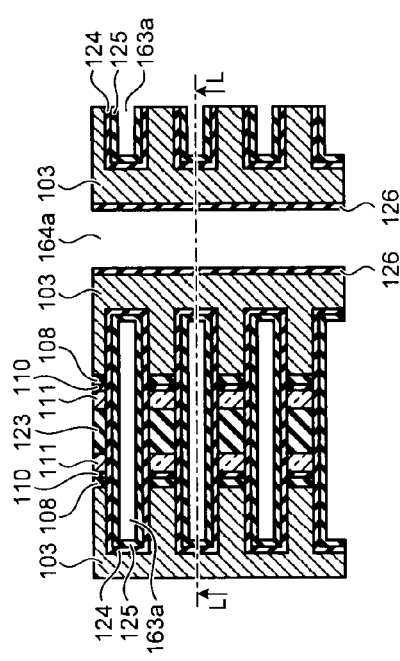

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2011-92978, filed on Apr. 19, 2011; the entire contents of which are incorporated herein by reference.

FIELD

Embodiments described herein relate generally to a nonvolatile semiconductor memory device and a method of manufacturing the same.

BACKGROUND

In the field of NAND flash memories, as a result of the rapid advance in downsizing of device size for a reduction in cost through enhancement of bit density, cell size has nearly reached a physical limit. Therefore, a stacked nonvolatile memory formed by three-dimensionally stacking memory cells attracts attention as means for attaining higher bit density. As the stacked nonvolatile memory, stacked nonvolatile memories of a metal-oxide-nitride-oxide-semiconductor (MONOS) type and a floating gate type in which a floating gate is formed in a doughnut shape are proposed.

However, in the stacked nonvolatile memory of the MONOS type, reliability of a memory operation is low. It is difficult to realize a multi-value operation such as multi-level-cell (MLC: information for two bits is stored in one memory cell) and triple-level-cell (TLC: information for three bits is stored in one memory cell) universally used in a floating gate structure.

In the stacked nonvolatile memory in which the floating gate electrode film is formed in a doughnut shape, a projection area of a memory cell (corresponding to a cell area in a planar floating gate type structure) is large. The structure and the process of the stacked nonvolatile memory are substantially different from those of a nonvolatile memory of a planar floating gate type widely used in the past. This hinders replacement of the nonvolatile memory of the planar floating gate type in the past with the stacked nonvolatile memory.

BRIEF DESCRIPTION OF THE DRAWINGS

FIGS. 12A to 12D are schematic sectional views of an example of the configuration of a nonvolatile semiconductor memory device according to a second embodiment;

FIGS. 13A to 21C are schematic sectional views of an example of a procedure of a method of manufacturing a nonvolatile semiconductor memory device according to the second embodiment.

DETAILED DESCRIPTION

In general, according to one embodiment, a nonvolatile semiconductor memory device includes sheet-like memory strings arranged in a matrix shape substantially perpendicularly to a substrate. Each of the memory string includes, in a height direction of a sheet-like semiconductor film, a plurality of memory cells each including a tunnel dielectric film, a floating gate electrode film, an inter-electrode dielectric film, and a control gate electrode film on a first principal plane of the sheet-like semiconductor film. The control gate electrode film includes a common connecting section that connects the control gate electrode films of the memory cells at the same height of the memory strings arranged in a first direction and extends in the first direction and an electrode forming section that is provided for each of the memory cells above or below the floating gate electrode film via the inter-electrode dielectric film to project from the common connecting section in a second direction orthogonal to the first direction. The floating gate electrode film has a shape extending in the second direction and is formed on the first principal plane of the sheet-like semiconductor film via the tunnel dielectric film. The memory cell has structure in which the floating gate electrode film is held, via the inter-electrode dielectric film, between the electrode forming sections of the upper and lower control gate electrode films.

Exemplary embodiments of a nonvolatile semiconductor memory device and a method of manufacturing the nonvolatile semiconductor memory device will be explained below in detail with reference to the accompanying drawings. The present invention is not limited to the following embodiments. Sectional views of the nonvolatile semiconductor memory device referred to in the embodiments are schematic. In some case, a relation between the thickness and the width of a layer, a ratio of thicknesses of layers, and the like are different from actual ones. Further, film thickness described below is an example and is not limited to this.

First Embodiment

Figure 1:
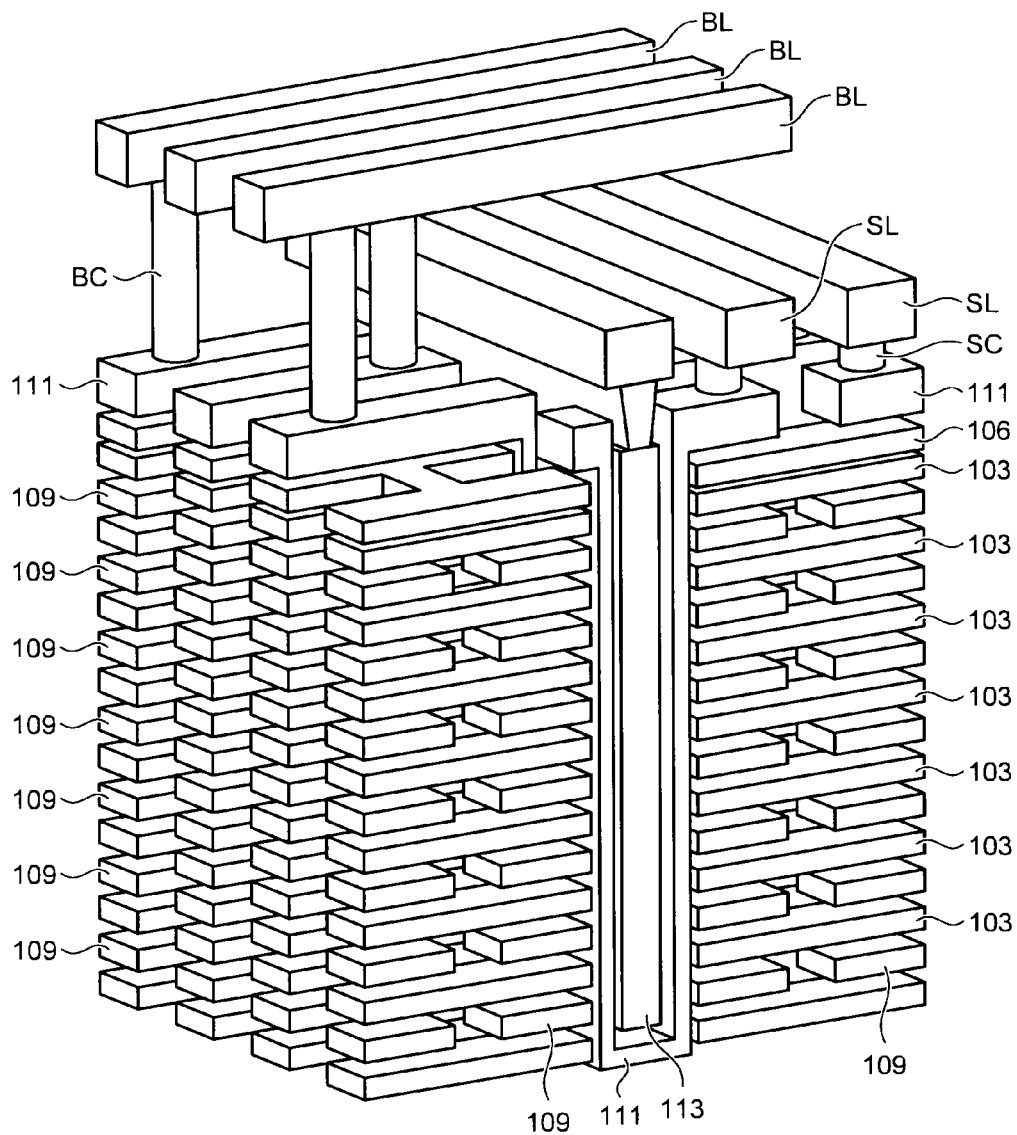
FIG. 1 is a schematic perspective view of an example of the structure of a nonvolatile semiconductor memory device according to a first embodiment.
Figure 2A:
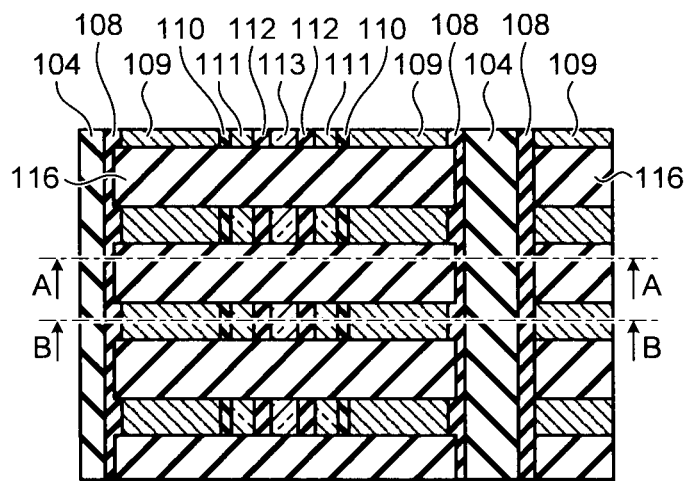
FIGS. 2A to 2D are schematic sectional views of an example of the configuration of the nonvolatile semiconductor memory device according to the first embodiment.
Figure 2B:
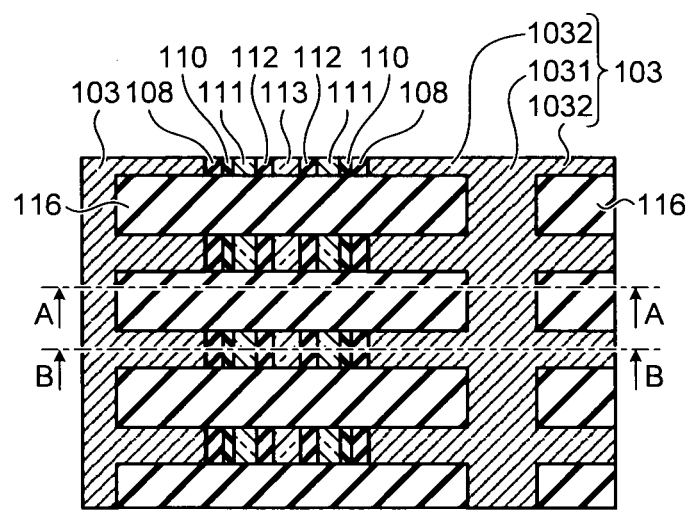
Figure 2C:
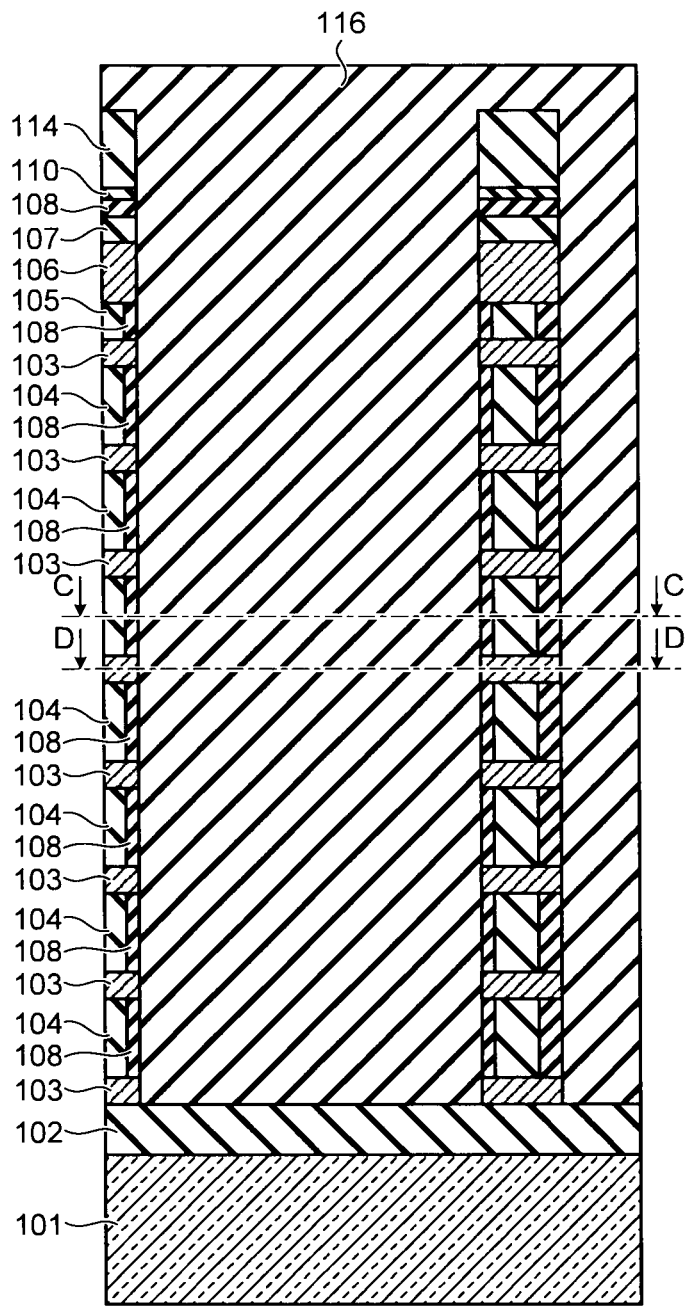
Figure 2D:
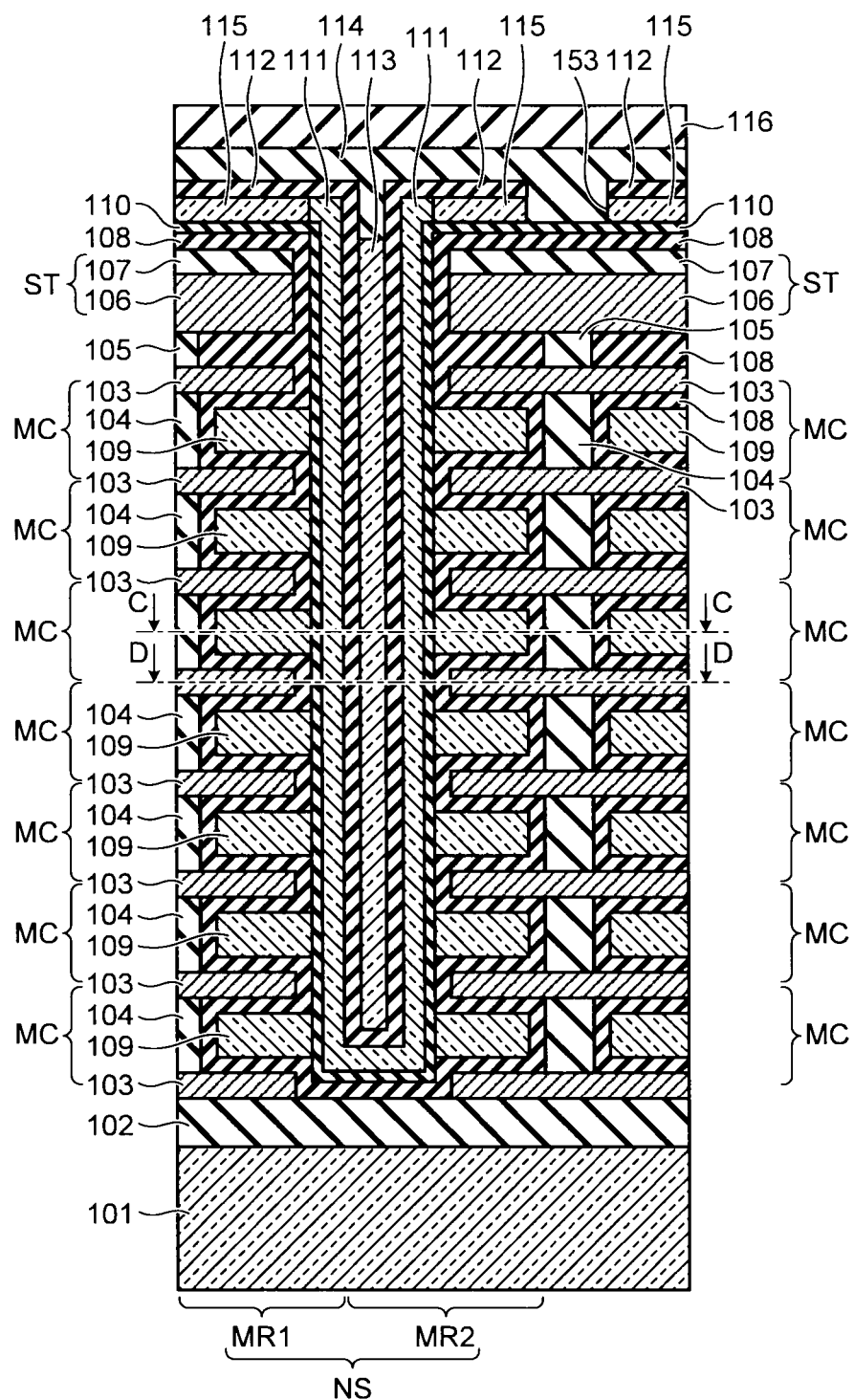

FIG. 1 is a schematic perspective view of an example of the structure of a nonvolatile semiconductor memory device according to a first embodiment. FIGS. 2A to 2D are schematic sectional views of an example of the configuration of the nonvolatile semiconductor memory device according to the first embodiment. FIG. 2A is a sectional view in a direction parallel to a substrate surface in a forming position of a floating gate electrode film. FIG. 2B is a sectional view in a direction parallel to the substrate surface in a forming position of a control gate electrode film. FIG. 2C is a sectional view taken along line A-A in FIGS. 2A and 2B. FIG. 2D is a sectional view taken along line B-B in FIGS. 2A and 2B. FIG. 2A is equivalent to a sectional view taken along line C-C in FIGS. 2C and 2D. FIG. 2B is equivalent to a sectional view taken along line D-D in FIGS. 2C and 2D. In FIG. 1, an insulating film is not shown.

The nonvolatile semiconductor memory device has structure in which U-shaped NAND strings NS are arranged in a matrix shape substantially perpendicularly to a semiconductor substrate 101 via an interlayer dielectric film 102. Each of the U-shaped NAND strings NS is formed by connecting, at one end (on the semiconductor substrate 101 side), a first memory cell row MR1 including a plurality of memory cell transistors (hereinafter simply referred to as "memory cells") MC formed in series on one principal plane of a sheet-like channel semiconductor film 111 and a second memory cell row MR2 including a plurality of memory cells MC formed in series on a principal plane on the opposite side of the first memory cell row MR1 of the other sheet-like channel semiconductor film 111. The memory cells MC at the same height of the memory cell rows MR1 and MR2 arrayed in a first direction are connected by control gate electrode films 103 (word lines) extending in the first direction.

The memory cell MC has structure of a floating gate type. The memory cell MC includes a floating gate electrode film 109 that extends in a second direction (a bit line direction) orthogonal to the first direction (a word line direction) and a pair of control gate electrode films 103 provided above and below the floating gate electrode film 109. Specifically, the memory cell MC has structure in which the control gate electrode films 103 are stacked in the height direction at a predetermined interval via an insulative sacrificial film 104 and the floating gate electrode film 109 is embedded between the upper and lower control gate electrode films 103 via an inter-electrode dielectric film 108. The floating gate electrode film 109 is formed on a channel semiconductor film 111 via a tunnel dielectric film 110. The control gate electrode film 103 includes a common connecting section 1031 that extends in the first direction and electrode forming sections 1032 provided above and below the floating gate electrode film 109 via the inter-electrode dielectric film 108 to project from the common connecting section 1031 in the second direction. A plurality of the memory cells MC having such structure are connected in series at a predetermined interval in the height direction of the channel semiconductor film 111. The memory cells MC vertically adjacent to each other share the electrode forming sections 1032 of the control gate electrode film 103 to form memory cell rows MR1 and MR2.

Two memory cell rows MR1 and MR2 forming one NAND string NS are arranged such that principal planes thereof above a side where the floating gate electrode film 109 and the control gate electrode film 103 are not formed are opposed to each other. A back gate electrode film 113 is provided, via the gate insulating film 112, between two sheet-like channel semiconductor films forming the U-shaped channel semiconductor film 111.

The control gate electrode films 103 forming the memory cells MC at the same height of the memory cell rows MR1 and MR2 above a side where two NAND strings NS adjacent to each other in the second direction are arranged to be opposed to each other are shared each other and form a word line. In other words, the control gate electrode film 103 has structure in which the electrode forming sections 1032 are formed to project from the common connecting section 1031 toward the channel semiconductor films 111 at the same height of the memory cell rows MR1 and MR2 present on both sides in the second direction across the common connecting section 1031 that extends in the first direction of the control gate electrode film 103.

Selection transistors ST are provided at both ends of the NAND string NS. The selection transistor ST includes a selection gate electrode film 106 on the channel semiconductor film 111 via the tunnel dielectric film 110 and the inter-electrode dielectric film 108. For example, a source-side selection transistor ST is arranged at the upper end of one memory cell row MR1 forming the NAND string NS and a drain-side selection transistor ST is arranged at the upper end of the other memory cell row MR2. Like the control gate electrode film 103, the selection gate electrode film 106 includes the common connecting section 1031 that extends in the first direction and the electrode forming sections 1032 provided to project in the second direction from the common connecting section 1031 toward the channel semiconductor films 111. The selection gate electrode films 106 forming the selection transistors ST of the memory cell rows MR1 and MR2 on a side where two NAND strings NS adjacent to each other in the second direction are arranged to be opposed to each other are shared each other and form a gate line.

The U-shaped NAND strings NS adjacent to each other in the first direction are separated by a gap-fill dielectric film 116. The floating gate electrode films 109 of the memory cells MC of the NAND strings NS adjacent to each other in the second direction are separated by the sacrificial film 104 that supports the shared control gate electrode film 103.

A plurality of the control gate electrode films 103 stacked at a predetermined interval via the sacrificial film 104 and a plurality of the floating gate electrode films 109 embedded between the upper and lower control gate electrode films 103 via the inter-electrode dielectric film 108 are stacked. A stacked structure in which a sacrificial film 105 and the inter-electrode dielectric film 108, the selection gate electrode film 106, and a hard mask film 107 are stacked are formed at a predetermined interval in the second direction. The channel semiconductor film 111 is formed in a U shape, via the tunnel dielectric film 110, between the stacked structures adjacent to each other. An end of the channel semiconductor film 111 is overlaid on the stacked structure. An impurity diffusion region 115 functioning as a source/drain region is formed in an overlaid section. The channel semiconductor films 111 of the NAND strings NS adjacent to each other in the second direction are separated by a section overlaid on the source-side selection transistor ST by an isolation trench 153.

As explained above, the back gate electrode film 113 is filled, via the gate insulating film 112, between the two sheet-like channel semiconductor films forming the U-shaped channel semiconductor film 111. A planarization film 114 is formed on the back gate electrode film 113 and the stacked structure. The gap-fill dielectric film 116 is formed on the planarization film 114.

The impurity diffusion region 115 formed at one end of the U-shaped channel semiconductor film 111 is a source region. As shown in FIG. 1, the source region is connected to a source line SL, which extends in the first direction, via a source line contact SC provided in the planarization film 114, the gap-fill dielectric film 116, or the like. The impurity diffusion region 115 formed at the other end of the U-shaped channel semiconductor film 111 is a drain region. As shown in FIG. 1, the drain region is connected to a bit line BL, which extends in the second direction, via a bit line contact BC provided in the planarization film 114, the gap-fill dielectric film 116, or the like.

In FIGS. 1 and 2A to 2D, the two sheet-like channel semiconductor films 111 have a U shape connected at the lower ends. However, the shape of the sheet-like channel semiconductor films 111 is not limited to this. For example, the sheet-like channel semiconductor films 111 can be arranged in a matrix shape substantially perpendicularly to the semiconductor substrate 101. In this case, the lower end of the sheet-like channel semiconductor film 111 is connected to the semiconductor substrate 101, the selection transistors ST are provided at the lower end and the upper end of the sheet-like channel semiconductor film 111, and the memory cell MC is provided between these two selection transistors ST.

The material of the semiconductor substrate 101 and the channel semiconductor film 111 can be selected out of, for example, Si, Ge, SiGe, SiSn, PbS, GaAs, InP, GaP, GaN, ZnSe, and InGaAsP. The U-shaped channel semiconductor film 111 can be formed of a single crystal semiconductor or can be formed of a polycrystal semiconductor.

As the tunnel dielectric film 110, a silicon oxide film or the like can be used. As the floating gate electrode film 109, an amorphous silicon film, a polycrystal silicon film, or the like can be used. As the inter-electrode dielectric film 108, a silicon oxide film or the like can be used. As the control gate electrode film 103 and the selection gate electrode film 106, a metal film of W, TaN, WN, TiAlN, TiN, WSi, CoSi, NiSi, PrSi, NiPtSi, PtSi, Pt, Ru, or the like, $RuO_2$, a B-doped polycrystal silicon film, a P-doped polycrystal silicon film, a silicide film, or the like can be used.

In the example shown in the figures, the memory cells MC in seven layers are stacked in the height direction of the channel semiconductor film 111 and the selection transistor ST is arranged on the memory cells MC. However, the number of stacked layers of the memory cells MC is not limited to this. The memory cells MC in a plurality of layers only have to be stacked and the selection transistor ST only has to be arranged at an end of the memory cells MC. The memory cell MC arranged adjacent to the selection transistor ST is likely to be deteriorated by the influence of a strong electric field by the selection transistor ST. Therefore, the memory cell MC is not used as the memory cell MC and is sometimes used as a dummy memory cell. The memory cell MC in the bottom layer can be used as a dummy memory cell.

Writing in an arbitrary floating gate electrode film 109 in the nonvolatile semiconductor memory device having such structure is performed by applying a program voltage $V_{pgm}$ to the two control gate electrode films 103 that hold the floating gate electrode film 109 from above and below. Erasing operation is performed by applying an erasing voltage $V_{ers}$ to the back gate electrode film 113. The memory cells MC are transistors of an Inversion type or a Depletion type not having a source/drain structure. In the transistors not having a source/drain structure, usually, high-density electrons are absent in a channel. Therefore, even if $V_{pass}$ is applied to an unselected cell, a malfunction due to program disturb or read disturb less easily occurs.

A method of manufacturing the nonvolatile semiconductor memory device having such structure is explained. FIGS. 3A to 10C are schematic sectional views of an example of a procedure of a method of manufacturing a nonvolatile semiconductor memory device according to the first embodiment. FIGS. 3A, 4A, 5A, 6A, 7A, 8A, 9A, and 10A are sectional views in a direction parallel to a substrate surface in a forming position of a floating gate electrode film. FIGS. 3B, 4B, 5B, 6B, 7B, 8B, 9B, and 10B are sectional views in a direction parallel to the substrate surface in a forming position of a control gate electrode film. FIGS. 3C, 4C, 5C, 6C, 7C, 8C, 9C, and 100 are sectional views taken along line E-E in FIGS. 3A, 4A, 5A, 6A, 7A, 8A, 9A, and 10A and FIGS. 3B, 4B, 5B, 6B, 7B, 8B, 9B, and 10B. FIGS. 3A, 4A, 5A, 6A, 7A, 8A, 9A, and 10A are respectively equivalent to sectional views taken along line F-F in FIGS. 3C, 4C, 50, 6C, 7C, 8C, 9C, and 10C. FIGS. 3B, 4B, 5B, 6B, 7B, 8B, 9B, and 10B are respectively equivalent to sectional views taken along line G-G in FIGS. 3C, 4C, 5C, 6C, 7C, 8C, 9C, and 10C.

Figure 3A:
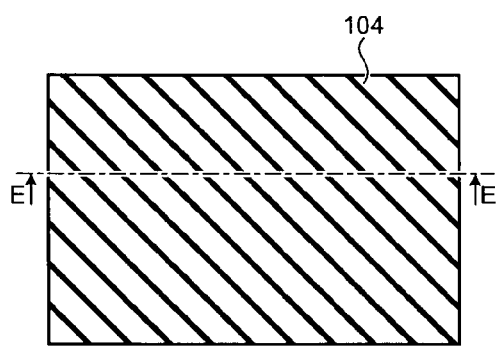
FIGS. 3A to 10C are schematic sectional views of an example of a procedure of a method of manufacturing a nonvolatile semiconductor memory device according to the first embodiment.
Figure 3B:
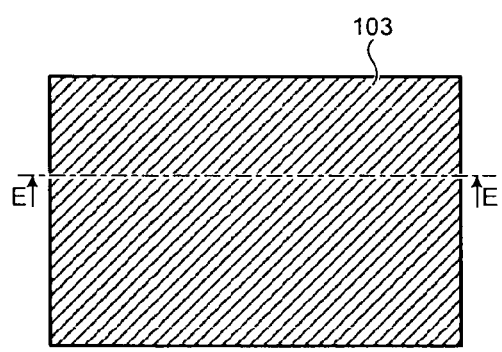
Figure 3C:
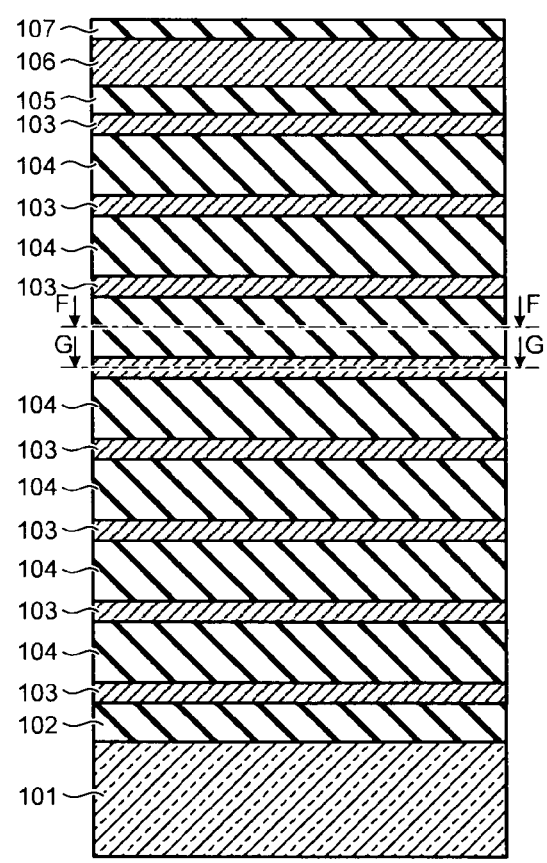

First, as shown in FIGS. 3A to 3C, a not-shown peripheral circuit of a nonvolatile semiconductor memory device is formed on the semiconductor substrate 101. Subsequently, the interlayer dielectric film 102 is formed over the entire surface of the semiconductor substrate 101. As the interlayer insulating film 102, for example, a silicon oxide film having thickness of 30 nanometers formed by a plasma enhanced chemical vapor deposition (CVD) method can be used.

Thereafter, on the interlayer dielectric film 102, the control gate electrode films 103 and the sacrificial films 104, which form memory cells, are alternately stacked in a plurality of layers. The top layer ends with the control gate electrode film 103. The control gate electrode films 103 are stacked in eight layers and the sacrificial films 104 are stacked in seven layers in this example. As the control gate electrode film 103, for example, a WSi film having thickness of 20 nanometers formed by the plasma CVD method can be used. As the sacrificial film 104, for example, a silicon oxide film having thickness of 44 nanometers formed by the plasma CVD method can be used. The sacrificial film 104 functions as an insulating film between the control gate electrode films 103 adjacent to each other in the height direction and functions as a sacrificial film for floating gate electrode film formation.

The sacrificial film 105 and the selection gate electrode film 106 are formed on the control gate electrode film 103 in the top layer. The sacrificial film 105 functions as an insulating film between the control gate electrode film 103 and the selection gate electrode film 106. As the sacrificial film 105, for example, a silicon oxide film having thickness of 20 nanometers formed by the plasma CVD method can be used. As the selection gate electrode film 106, for example, a WSi film having thickness of 40 nanometers formed by the plasma CVD method can be used.

The hard mask film 107 is formed on the selection gate electrode film 106. The hard mask film 107 functions as a cap layer when the selection gate electrode film 106 to the control gate electrode film 103 in the bottom layer are processed by etching at a later step. As the hard mask film 107, for example, a silicon nitride film having thickness of 20 nanometers formed by the plasma CVD method can be used.

As a method of forming a stacked film from the interlayer dielectric film 102 to the hard mask film 107, besides the plasma CVD method, techniques such as a sub-atmospheric CVD (SACVD) method, a low pressure CVD (LPCVD) method, a sputtering method, and Spin-On Dielectric (SOD) can be used in combination as appropriate.

Figure 4A:
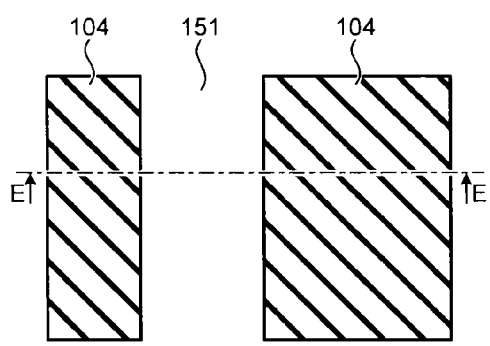
Figure 4B:
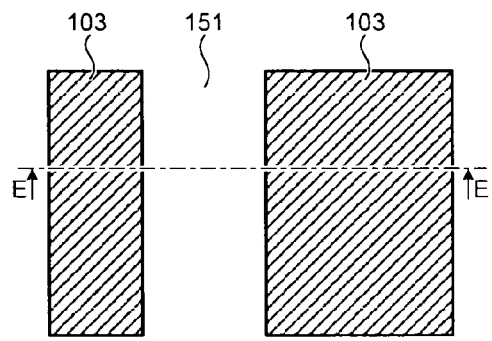
Figure 4C:
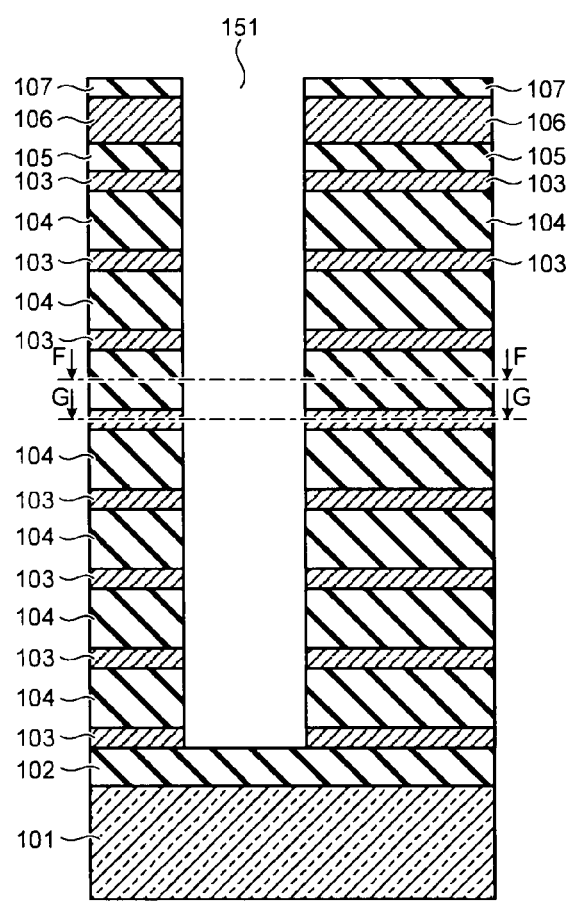

Subsequently, as shown in FIGS. 4A to 4C, a not-shown mask film is formed over the entire surface of the semiconductor substrate 101. The stacked film including the control gate electrode films 103, the sacrificial films 104 and 105, the selection gate electrode film 106, and the hard mask film 107 is collectively processed by a lithography technique and a reactive ion etching technique (hereinafter referred to as "RIE method") to connect to the interlayer dielectric film 102 and form an isolation trench 151 that extends in the first direction. The isolation trench 151 divides a region formed as a floating gate electrode film later and is formed at a predetermined interval in the second direction. As the mask film, a CVD carbon film can be used. After the formation of the isolation trench 151, the mask film is removed.

Figure 5A:
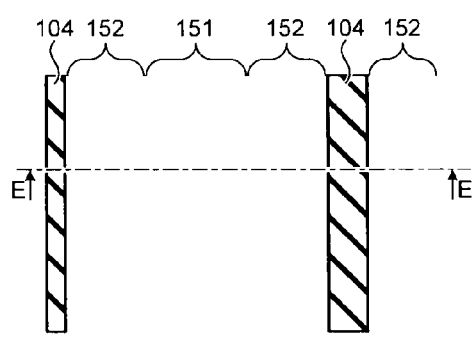
Figure 5B:
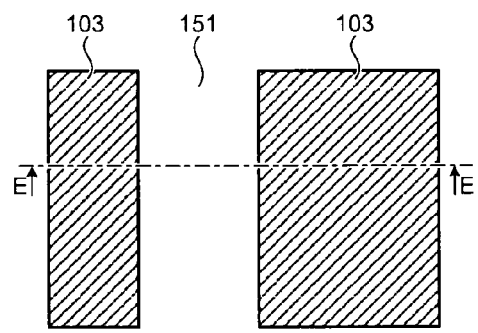
Figure 5C:
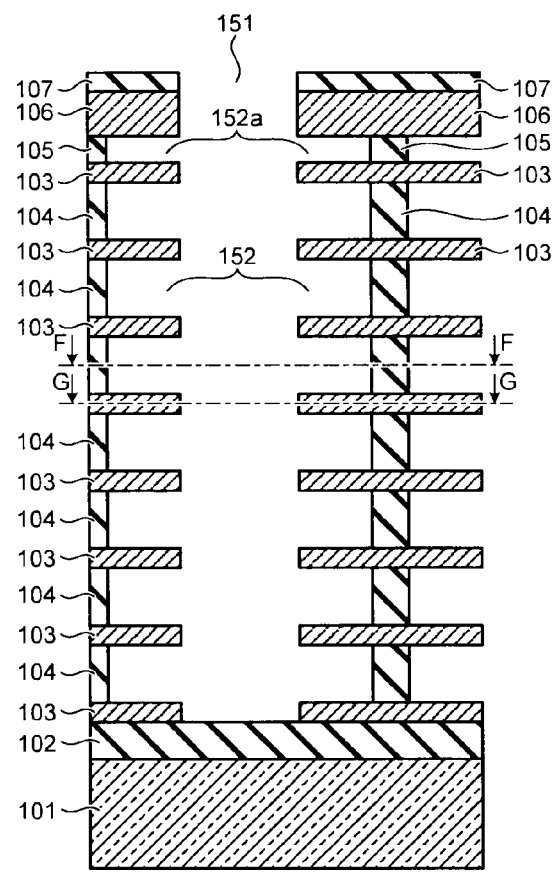

Thereafter, as shown in FIGS. 5A to 5C, the sacrificial films 104 and 105 are recessed by a predetermined amount by isotropic etching from ends of the control gate electrode films 103 and the selection gate electrode films 106 formed by the isolation trench 151 to form a space 152 for filling a floating gate electrode film and a space 152a for filling an interelectrode dielectric film between the control gate electrode film 103 and the selection gate electrode film 106 in the top layer. As the isotropic etching, for example, wet etching using buffered fluoric acid or dry etching using down-flow plasma of $NF_3/NH_3$ mixed gas, or the like can be used. Consequently, the sacrificial films 104 and 105 remain near the center in the second direction of the control gate electrode films 103 and the selection gate electrode films 106 divided by the isolation trench 151. The sacrificial films 104 and 105 support the control gate electrode films 103 and the selection gate electrode films 106.

Figure 6A:
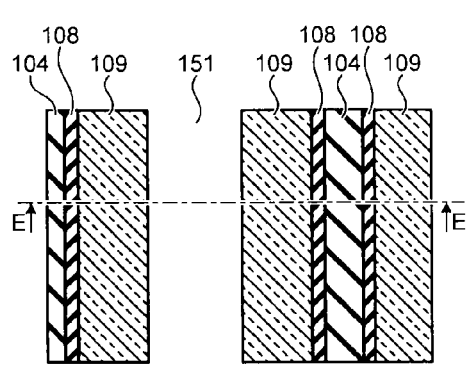
Figure 6B:
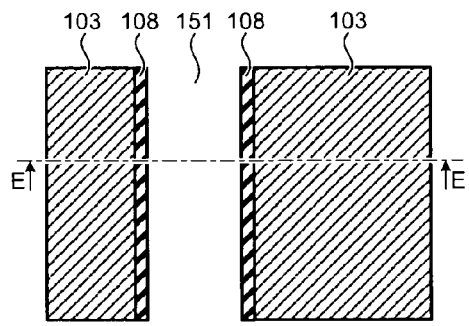
Figure 6C:
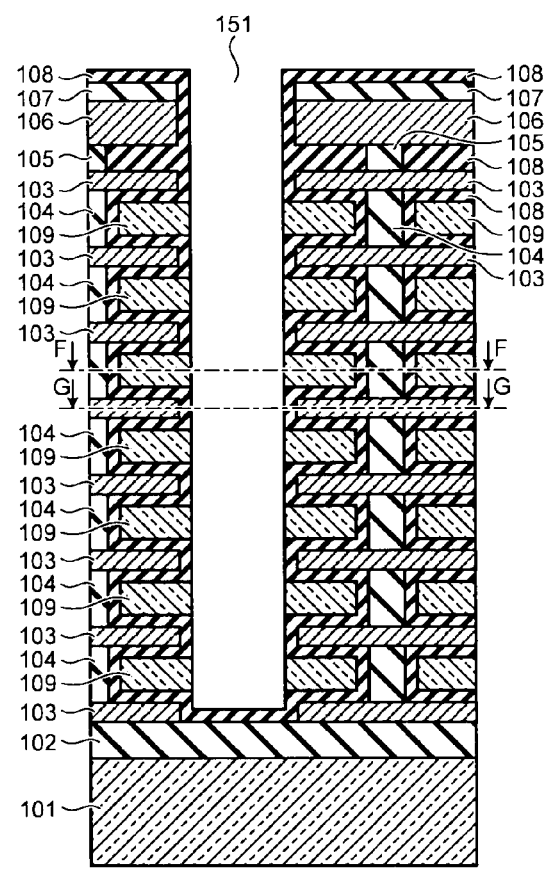

Then, as shown in FIGS. 6A to 6C, the inter-electrode dielectric film 108 is formed over the entire surface of the semiconductor substrate 101. The inter-electrode dielectric film 108 is formed to conformally cover the stacked film constituted to the control gate electrode films 103 and the selection gate electrode film 106 supported by the sacrificial films 104 and 105, and the hard mask films 107. Subsequently, the floating gate electrode film 109 is formed over the entire surface of the semiconductor substrate 101. As the inter-electrode dielectric film 108, for example, an SiO—SiN—SiO stacked film (ONO film) having thickness of 12 nanometers formed by an atomic layer deposition (ALD) method can be used. As the floating gate electrode film 109, for example, a P-doped amorphous silicon film having thickness of 15 nanometers formed by the LPCVD method can be used. P density in forming the P-doped amorphous silicon film can be set to $1 \times 10^{20}$ to $5 \times 10^{20}$ $cm^{-3}$. Thereafter, the floating gate electrode film 109 is recessed to be left only in the space 152 by dry etching. As an etching gas for the etching, for example, a chlorine gas can be used.

When the inter-electrode dielectric film 108 is formed, because the sacrificial films 105 between the selection gate electrode films 106 and the control gate electrode films 103 in the top layer are thin compared with the sacrificial films 104, the space 152a between the selection gate electrode films 106 and the control gate electrode films 103 in the top layer is completely embedded by the inter-electrode dielectric film 108. As a result, the floating gate electrode film 109 is not formed in the space 152a.

Figure 7A:
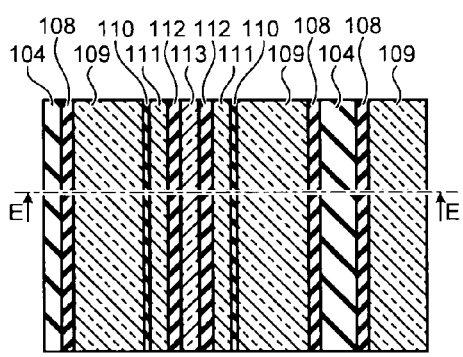
Figure 7B:
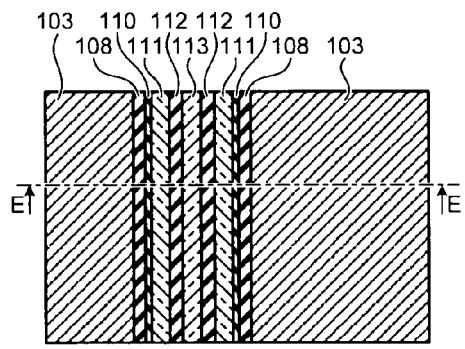
Figure 7C:
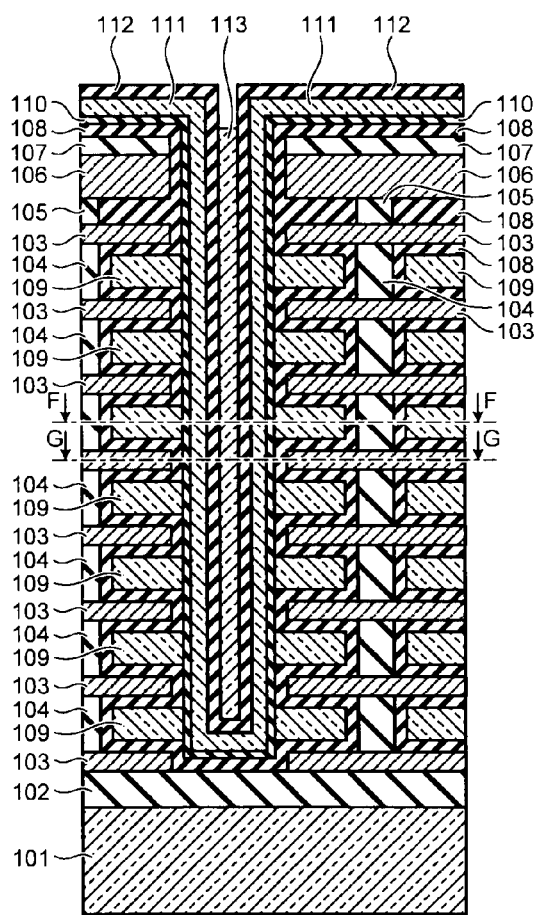

Thereafter, as shown in FIGS. 7A to 7C, the tunnel dielectric film 110 and the channel semiconductor film 111 are formed over the entire surface of the semiconductor substrate 101. Consequently, the tunnel dielectric film 110 and the channel semiconductor film 111 are formed to cover upper parts of the hard mask films 107 and the sidewalls and the bottom of the isolation trench 151. As the tunnel dielectric film 110, for example, a silicon oxide film having thickness of 8 nanometers formed by the ALD method can be used. As the channel semiconductor film 111, for example, a B-doped amorphous silicon film having thickness of 15 nanometers formed by the ALD method can be used. B density in forming the B-doped amorphous silicon film can be set to $1 \times 10^{17}$ to $1 \times 10^{18}$ $cm^{-3}$. Consequently, the cross section of the deposited channel semiconductor film 111 is in a U shape in the isolation trench 151.

Subsequently, the gate insulating film 112 of the back gate electrode film 113 is formed over the entire surface of the semiconductor substrate 101. As the gate insulating film 112, for example, a silicon oxide film having thickness of 15 nanometers formed by the ALD method can be used. The cross section of the gate insulating film 112 is also formed in a U shape in the isolation trench 151. The back gate electrode film 113 is formed over the entire surface of the semiconductor substrate 101. The back gate electrode film 113 formed in an upper part of the collectively processed stacked film is recessed by the dry etching. As the back gate electrode film 113, for example, a P-doped amorphous silicon film having thickness of 15 nanometers formed by the ALD method can be used. P density in forming the P-doped amorphous silicon film can be set to $1 \times 10^{20}$ to $1 \times 10^{20}$ $cm^{-3}$. As an etching gas used in removing the back gate electrode film 113, for example, a chlorine gas can be used. Consequently, the back gate electrode film 113 is filled in the isolation trench 151 covered with the tunnel dielectric film 110, the channel semiconductor film 111, and the gate insulating film 112.

Figure 8A:
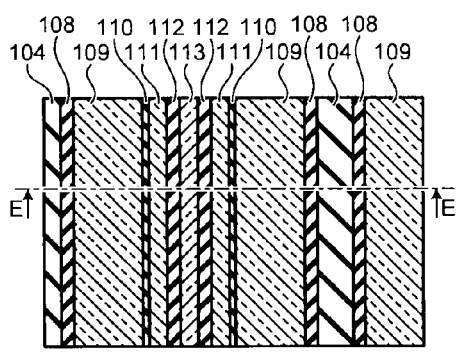
Figure 8B:
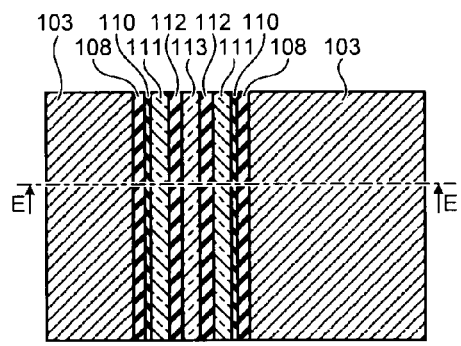
Figure 8C:
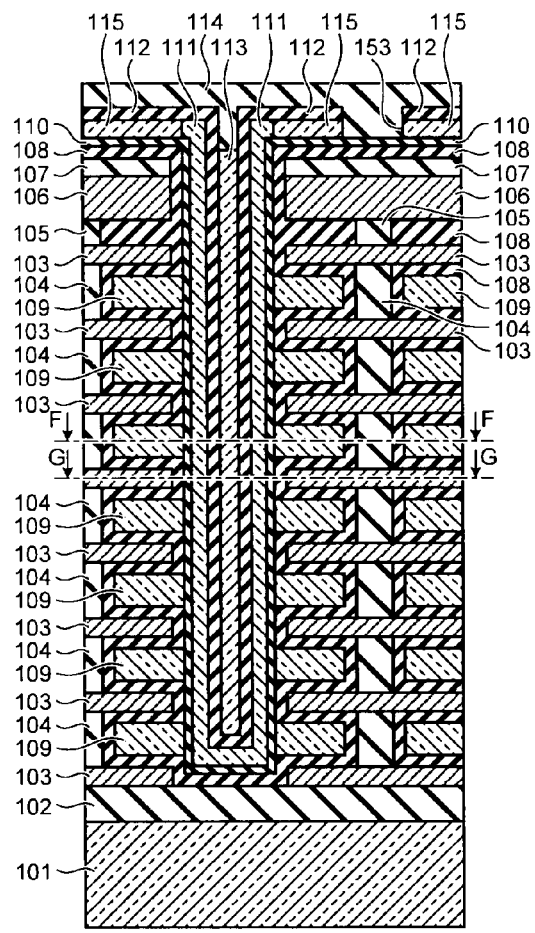

Subsequently, as shown in FIGS. 8A to 8C, the gate insulating films 112 on the hard mask films 107 and the channel semiconductor film 111 are processed by the lithography technique and the RIE method to form an isolation trench 153. Consequently, the NAND strings NS adjacent to each other in the second direction are isolated. The isolation trench 153 can be formed in, for example, a position corresponding to an arrangement position of the sacrificial films 104 and 105. The planarization film 114 is formed over the entire surface of the semiconductor substrate 101 and planarized by a chemical mechanical polishing (CMP) technique. As the planarization film 114, for example, a silicon oxide film formed by the plasma CVD method can be used.

Thereafter, impurities of a predetermined conduction type are implanted in the channel semiconductor film 111 overlaid on the stacked film (the hard mask films 107) by the lithography technique and the ion implantation technique to form the impurity diffusion region 115. The impurity diffusion region 115 functioning as an N-type source/drain region can be formed in the channel semiconductor film 111 by, for example, ion-implanting As.

Figure 9A:
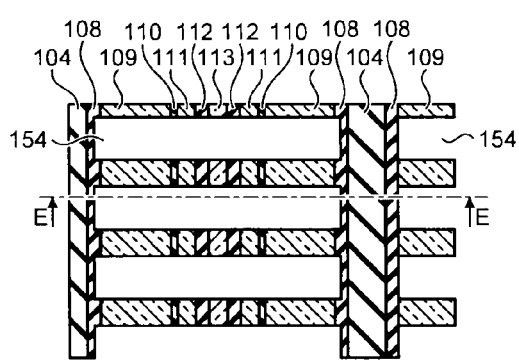
Figure 9B:
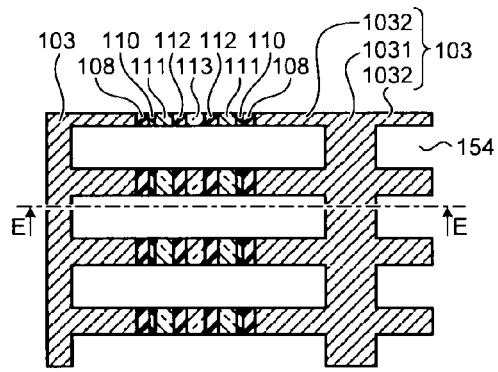
Figure 9C:
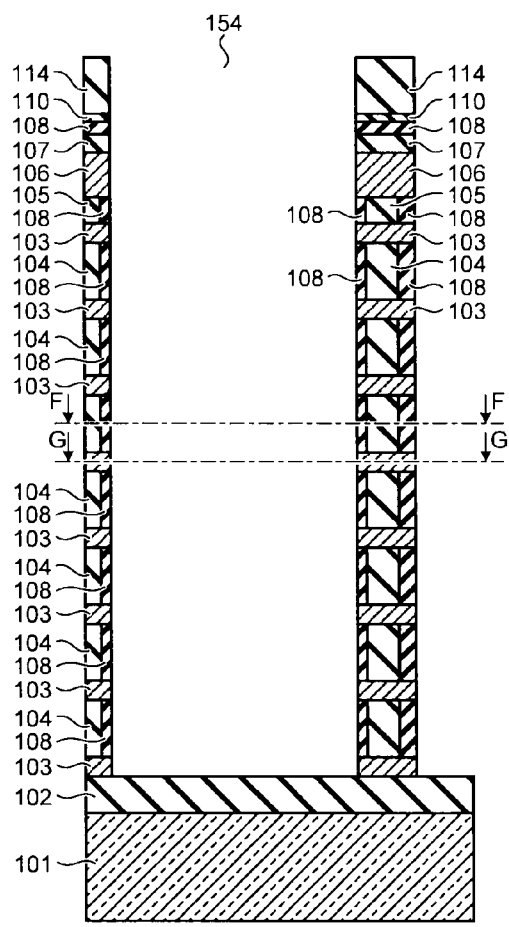

Subsequently, as shown in FIGS. 9A to 9C, a not-shown mask film is formed over the entire surface of the semiconductor substrate 101 and processed to arrange the NAND strings NS on the semiconductor substrate 101 in a matrix shape using the lithography technique and the RIE method. The NAND strings NS are separated by collectively processing the stacked film and forming a trench 154, which connects to the interlayer dielectric film 102, such that the NAND strings NS are arranged at a predetermined interval in the first direction in regions divided by the sacrificial films 104 and 105 arrayed in the second direction. The trench 154 only has to be capable of cutting at least the floating gate electrode films 109 and the channel semiconductor films 111 of the NAND strings NS adjacent to each other in the first direction.

Consequently, the control gate electrode films 103 and the selection gate electrode films 106 are processed to include the common connecting section 1031 that extends in the first direction like the sacrificial films 104 and 105, and the electrode forming films 1032 formed for each of the memory cells MC to project in the second direction from the common connecting section 1031. The electrode forming sections 1032 are held between the upper and lower floating gate electrode films 109. The common connecting section 1031 connects, in common, the electrode forming sections 1032 at the same height of the NAND strings NS arrayed in the first direction.

By forming the trench 154, in each of the memory cells MC, the channel semiconductor film 111 is automatically aligned and formed without deviating from a forming position of the floating gate electrode film 109. The floating gate electrode film 109 is formed to be connected to the side surface of the channel semiconductor film 111 via the tunnel dielectric film 110 in advance. Therefore, when the trench 154 is formed, the U-shaped channel semiconductor film 111 can be formed in a self-aligning manner with respect to the floating gate electrode film 109. By the formation of the trench 154, memory cells of the floating gate type are collectively formed. As the mask film, a CVD carbon film can be used. After processing the trench 154, the mask film is removed.

Figure 10A:
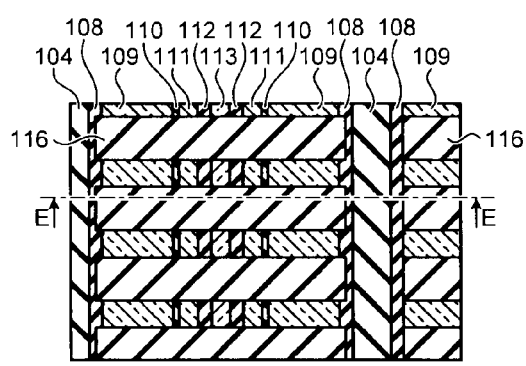
Figure 10B:
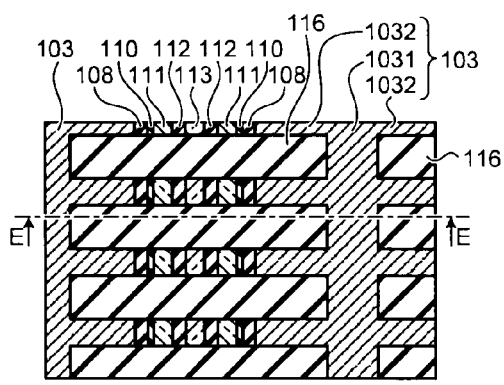
Figure 10C:
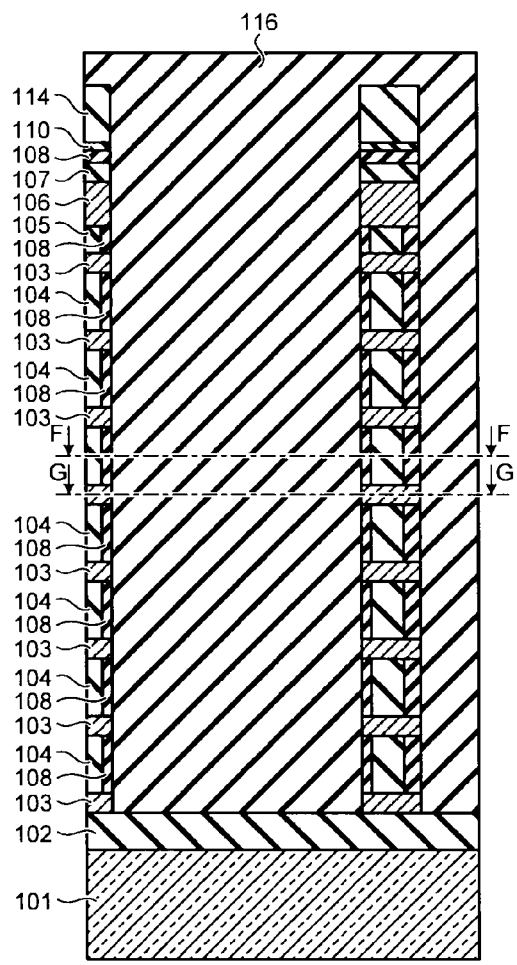

Subsequently, as shown in FIGS. 10A to 10O, to remove damage during the processing of the trench 154, post oxidation by plasma oxidation is performed. Thereafter, the gap-fill dielectric film 116 is formed to fill the trench 154 such that the upper surface of the gap-fill dielectric film 116 is higher than the planarization film 114. As the gap-fill dielectric film 116, for example, a silicon oxide film formed by the LPCVD method can be used.

Thereafter, after a not-shown interlayer dielectric film is formed, formation of wires and contact plugs is performed. However, the wires and the contact plugs can be formed by a publicly-known method. Therefore, detailed explanation of the formation is omitted. The nonvolatile semiconductor memory device according to the first embodiment is obtained.

Figure 11:
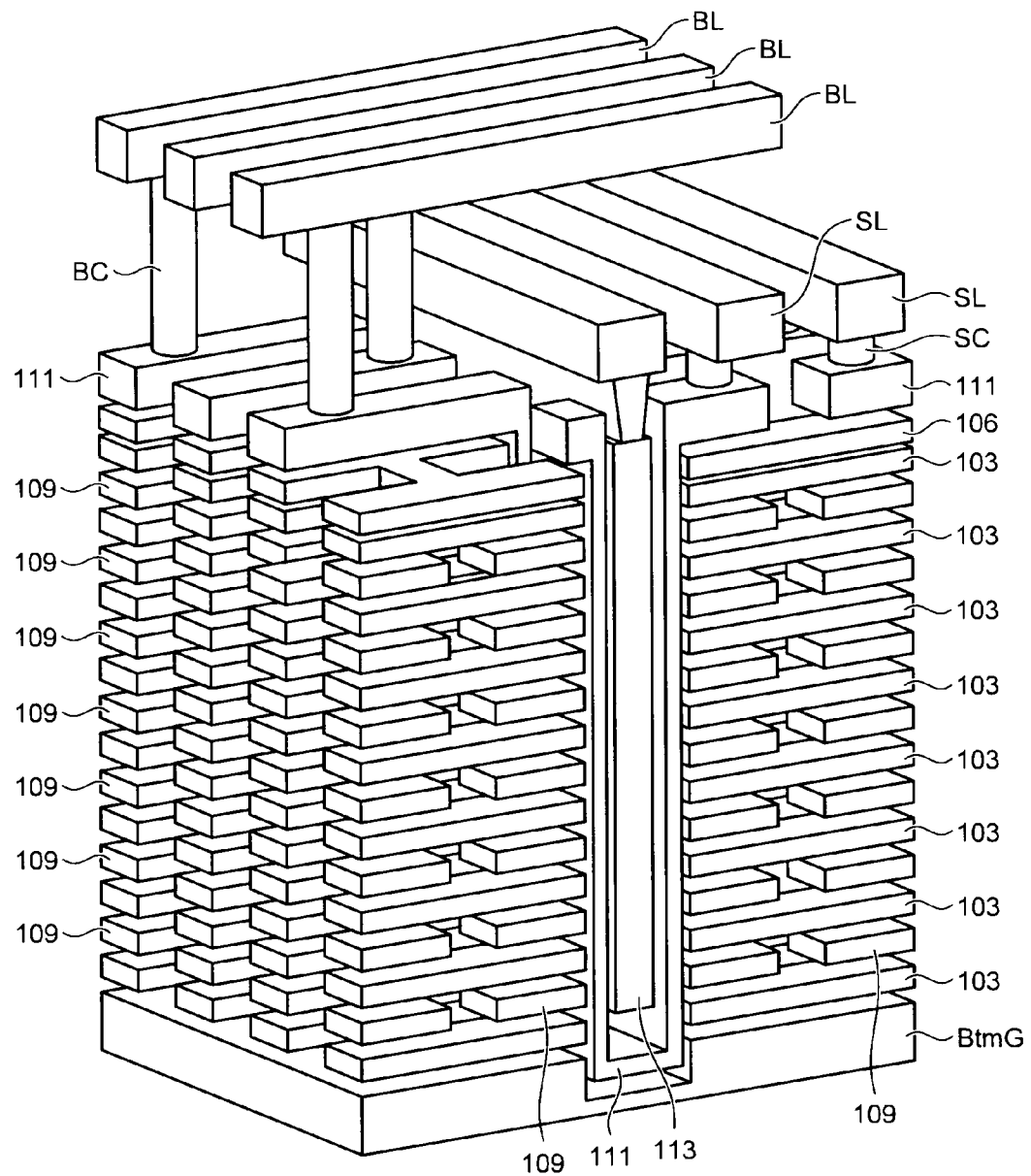
FIG. 11 is a schematic perspective view of another example of the structure of the nonvolatile semiconductor memory device according to the first embodiment.

FIG. 11 is a schematic perspective view of another example of the structure of the nonvolatile semiconductor memory device according to the first embodiment. In the figure, as in the figures referred to above, the insulating film is not shown. In the nonvolatile semiconductor memory device, a bottom electrode film BtmG is further provided via a not-shown interlayer dielectric film under the control gate electrode film 103 in the bottom layer in the structure shown in FIG. 1. In this case, the U-shaped channel semiconductor film 111 does not pierce through the bottom electrode film BtmG. The bottom electrode film BtmG is provided to surround the bottom of the U-shaped channel semiconductor film 111 via a not-shown gate insulating film. Consequently, an electric field can be applied from the bottom electrode film BtmG. Depletion region control for a channel is more easily performed.

As explained above, in the first embodiment, the memory cell rows provided in series are arranged in a matrix shape on a substrate. The memory cell row includes, in a height direction of the channel semiconductor film 111, a plurality of memory cells MC in which the floating gate electrode film 109 that extends in the second direction via the tunnel dielectric film 110 is provided on the side surface of the sheet-like channel semiconductor film 111 extended substantially perpendicularly to the substrate surface and the control gate electrode films 103 are provided on the upper and lower sides of the floating gate electrode film 109 via inter-electrode dielectric film 108. And the control gate electrode films 103 at the same height of the memory cell rows adjacent to each other in the first direction are connected in common. This makes it possible to reduce a projection area of the memory cell MC compared with the stacked nonvolatile semiconductor memory device including the floating gate electrode film 109 having a doughnut shape. Each of the memory cells MC has structure same as the structure of the nonvolatile semiconductor memory device of the planar floating gate type widely used in the past as explained above. Therefore, it is easy to replace the nonvolatile semiconductor memory device of the planar floating gate type in the past with the stacked nonvolatile semiconductor memory device attaining higher bit density. The structure in which the memory cells MC of the floating gate type already having satisfactory market perception as the nonvolatile semiconductor memory device are stacked is adopted. Therefore, there is an effect that it is easy to secure reliability. There is also an effect that it is easy to realize multi-value memories such as MLC (2 bits/cell), TLC (3 bits/cell), and QLC (4 bits/cell).

Further, it is possible to stack the memory cells MC without substantially increasing the number of processes and improve a bit capacity per a unit area by adopting a shape for allowing collective processing of stacked layers. In other words, there is an effect that a degree of integration can be improved without performing scaling.

After the control gate electrode films 103 and the sacrificial films 104 are alternately stacked to form a stacked film and the isolation trench 151 that extends in the first direction is formed in the stacked film is formed at a predetermined interval, the sacrificial films 104 are recessed by a predetermined amount by etching and the space 152 is formed between the sacrificial films 104. Subsequently, the inter-electrode dielectric film 108 is conformally formed in the space 152. The floating gate electrode film 109 is embedded in the space 152. After the tunnel dielectric film 110 and the channel semiconductor film 111 are formed to conformally cover the isolation trench 151, the trench 154 is formed to separate the memory cell rows in the first direction. This makes it possible to form, in a self-aligning manner, the floating gate electrode films 109, the control gate electrode films 103, and the channel semiconductor films 111.

Unlike the normal NAND flash memory, in the nonvolatile semiconductor memory device according to the first embodiment, the channel semiconductor film 111 potential is floating from the semiconductor substrate 101. Therefore, although it is difficult to perform erasing, an erasing characteristic can be improved by using the back gate electrode film 113 formed via the gate insulating film 112 on the surface on the opposite side of the memory cell MC forming surface of the sheet-like channel semiconductor film 111.

The channel semiconductor film 111 is formed to include the section perpendicular to the semiconductor substrate 101 and the section parallel to the semiconductor substrate 101 overlaid on the hard mask film 107. The impurity diffusion region 115 is formed in the section parallel to the substrate surface. Therefore, there is also an effect that, compared with forming the impurity diffusion region 115 in the section perpendicular to the substrate surface, formation of the impurity diffusion region 115 is easy.

Second Embodiment

In the structure explained in the first embodiment, the control gate electrode film is shared between the NAND strings adjacent to each other in the second direction (the extending direction of the bit line) and the gap-fill dielectric film is formed between the NAND strings adjacent to each other in the first direction (the extending direction of the word line). In the second embodiment, a nonvolatile semiconductor memory device having structure in which air gaps are formed between NAND strings adjacent to each other in the first direction and the second direction is explained. In the example explained in the first embodiment, the sacrificial films, the control gate electrode films, and the selection gate electrode films are formed of different materials to manufacture the nonvolatile semiconductor memory device. However, in an example explained in the second embodiment, the sacrificial films, the control gate electrode films, and the selection gate electrode films are formed of the same material to manufacture the nonvolatile semiconductor memory device.

Figure 12A:
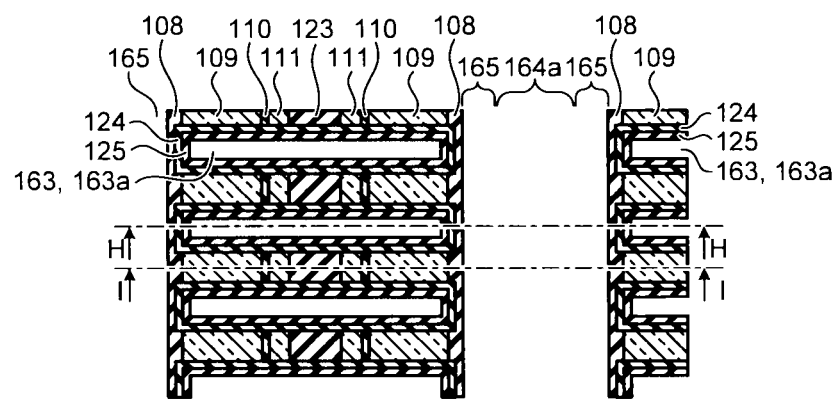
Figure 12B:
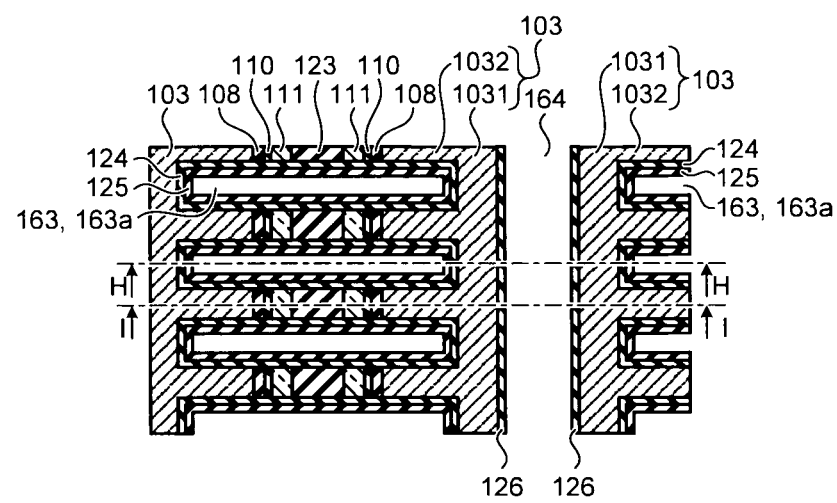

FIGS. 12A to 12D are schematic sectional views of an example of the configuration of a nonvolatile semiconductor memory device according to the second embodiment. FIG. 12A is a sectional view in a direction parallel to a substrate surface in a forming position of a floating gate electrode film. FIG. 12B is a sectional view in a direction parallel to the substrate surface in a forming position of a control gate electrode film. FIG. 12C is a sectional view taken along line H-H in FIGS. 12A and 12B. FIG. 12D is a sectional view taken along line I-I in FIGS. 12A and 12B. FIG. 12A is equivalent to a sectional view taken along line J-J in FIGS. 12C and 12D. FIG. 12B is equivalent to a sectional view taken along line K-K in FIGS. 12C and 12D.

The basic structure of the nonvolatile semiconductor memory device according to the second embodiment is the same as the basic structure of the nonvolatile semiconductor memory device according to the first embodiment. Therefore, differences from the first embodiment are explained. As in the first embodiment, the nonvolatile semiconductor memory device has structure in which the U-shaped NAND strings NS are arranged in a matrix shape substantially perpendicularly to the semiconductor substrate 101. A trench 163 is formed between the NAND strings NS adjacent to each other in the first direction. An insulating film 124 is formed to cover the side surfaces and the bottom surface in the trench 163. An interlayer dielectric film 125 is provided to cover the upper surface between the NAND strings NS adjacent to each other in the first direction. Consequently, an air gap 163a is provided between the NAND strings NS adjacent to each other in the first direction.

A trench 164 is also formed between the NAND strings NS adjacent to each other in the second direction. However, the trench 164 is formed to extend in the first direction. Consequently, the control gate electrode film 103 shared between the memory cells MC opposed to each other at the same height of the NAND strings NS adjacent to each other in the second direction in the first embodiment is not shared between the NAND strings NS adjacent to each other in the second direction and is shared only between the NAND strings NS adjacent to each other in the first direction. In the trench 164, the control gate electrode films 103 are formed to project compared with the ends in the second direction of the inter-electrode dielectric films 108 forming the memory cell MC. The selection gate electrode films 106, the hard mask films 107, the inter-electrode dielectric films 108, the tunnel dielectric films 110, the impurity diffusion regions 115 (the channel semiconductor films 111), gap-fill dielectric films 123, insulating films 124, and interlayer dielectric films 125 formed above the control gate electrode films 103 in the top layer are also formed to project compared with the ends in the second direction of the inter-electrode dielectric films 108 forming the memory cell MC. An interlayer dielectric film 126 is provided to cover the side surfaces and the bottom surface of the portion projecting in the trench 164 and cover the upper surface between the NAND strings NS adjacent to each other in the second direction. Consequently, an air gap 164a is also provided between the NAND strings NS adjacent to each other in the second direction.

Further, in the first embodiment, the back gate electrode film 113 is formed via the gate insulating film 112 in the section held between the two sheet-like channel semiconductor films 111 of the U-shaped channel semiconductor films 111. However, in the second embodiment, a back gate electrode film is not provided.

Components same as those in the first embodiment are denoted by the same reference numerals and signs and explanation of the components is omitted. In the second embodiment, as in the first embodiment, the channel semiconductor film 111 has a U shape. However, the shape of the channel semiconductor film 111 is not limited to this. For example, the sheet-like channel semiconductor films 111 can be arranged in a matrix shape substantially perpendicularly to the semiconductor substrate 101. In this case, the lower end of the sheet-like channel semiconductor film 111 is connected to the semiconductor substrate 101. The selection transistors ST are provided at the lower end and the upper end of the sheet-like channel semiconductor film 111. The memory cell MC is provided between these two selection transistors ST.

FIGS. 13A to 21C are schematic sectional views for explaining an example of a procedure of a method of manufacturing a nonvolatile semiconductor memory device according to the second embodiment. FIGS. 13A, 14A, 15A, 16A, 17A, 18A, 19A, 20A, and 21A are sectional views in a direction parallel to a substrate surface in a forming position of a floating gate electrode film. FIGS. 13B, 14B, 15B, 16B, 17B, 18B, 19B, 20B, and 21B are sectional views in a direction parallel to the substrate surface in a forming position of a control gate electrode film. FIGS. 13C, 14C, 15C, 16C, 17C, 18C, 19C, 20C, and 21C are sectional views taken along line L-L in FIGS. 13A, 14A, 15A, 16A, 17A, 18A, 19A, 20A, and 21A and FIGS. 13B, 14B, 15B, 16B, 17B, 18B, 19B, 20B, and 21B. FIGS. 13A, 14A, 15A, 16A, 17A, 18A, 19A, 20A, and 21A are equivalent to sectional views taken along line M-M in FIGS. 13C, 14C, 15C, 16C, 17C, 18C, 19C, 20C, and 21C. FIGS. 13B, 14B, 15B, 16B, 17B, 18B, 19B, 20B, and 21B are equivalent to sectional views taken along line N-N in FIGS. 13C, 14C, 15C, 16C, 17C, 18C, 19C, 20C, and 21C.

Figure 13C:
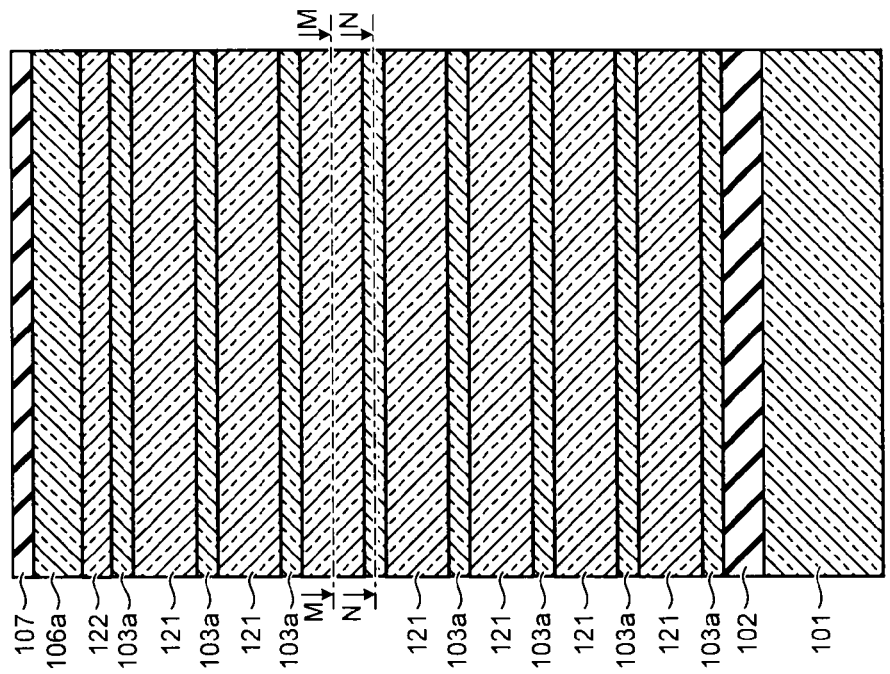
Figure 13A:
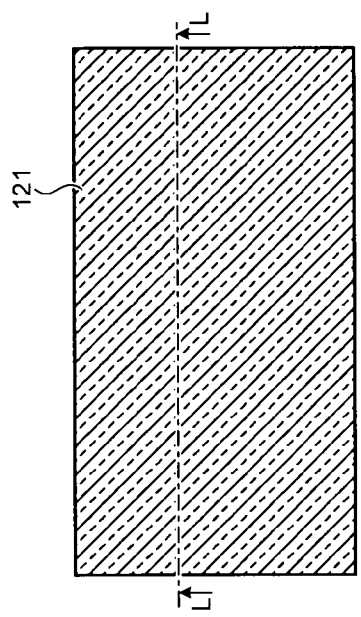
Figure 13B:
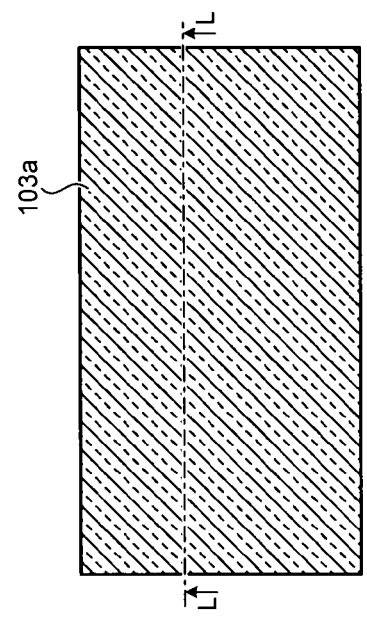

First, as shown in FIGS. 13A to 13C, a not-shown peripheral circuit of a nonvolatile semiconductor memory device is formed on the semiconductor substrate 101. Subsequently, the interlayer dielectric film 102 is formed over the entire surface of the semiconductor substrate 101. As the interlayer dielectric film 102, for example, a silicon oxide film having thickness of 100 nanometers formed by the plasma CVD method can be used.

Thereafter, on the interlayer dielectric film 102, control gate electrode films 103a and sacrificial films 121, which form memory cells, are alternately stacked in a plurality of layers. The top layer ends with the control gate electrode film 103a. A sacrificial film 122 and a selection gate electrode film 106a are formed on the control gate electrode film 103a in the top layer. When the films are formed, the control gate electrode films 103a, the sacrificial films 121 and 122, and the selection gate electrode film 106a are formed of the same material. As the control gate electrode film 103a, for example, a B-doped amorphous silicon film having thickness of 20 nanometers can be used. As the sacrificial film 121, for example, an amorphous silicon film having thickness of 40 nanometers can be used. As the sacrificial film 122, for example, an amorphous silicon film having thickness of 20 nanometers can be used. As the selection gate electrode film 106a, for example, a B-doped amorphous silicon film having thickness of 40 nanometers can be used. The control gate electrode film 103a, the sacrificial films 121 and 122, and the selection gate electrode film 106a are collectively formed by the plasma CVD method or the LPCVD method. The sacrificial film 121 is a sacrificial film for floating gate electrode film formation. The sacrificial film 122 functions as a sacrificial film when an inter-electrode dielectric film is formed between the control gate electrode film 103a in the top layer and the selection gate electrode film 106a.

Further, the hard mask film 107 is formed on the selection gate electrode film 106a. The hard mask film 107 functions as a cap layer when the selection gate electrode film 106a to the control gate electrode film 103a in the bottom layer are processed by etching at a later step. As the hard mask film 107, for example, a silicon nitride film having thickness of 20 nanometers formed by the plasma CVD method can be used.

As a method of forming the stacked film from the interlayer dielectric film 102 to the hard mask film 107, besides the plasma CVD method and the LPCVD method, techniques such as the SACVD method, the sputtering method, and the SOD can be used in combination as appropriate.

Subsequently, as shown in FIGS. 14A to 14C, a not-shown mask film is formed over the entire surface of the semiconductor substrate 101. The stacked film including the control gate electrode film 103a, the sacrificial films 121 and 122, the selection gate electrode film 106a, and the hard mask film 107 is collectively processed by the lithography technique and the RIE method to form an isolation trench 161 for forming a semiconductor channel. The isolation trench 161 connects to the interlayer dielectric film 102 and extends in the first direction. The isolation trench 161 is formed at a predetermined interval in the second direction. As the mask film, a CVD carbon film can be used. After the formation of the isolation trench 161, the mask film is removed.

Thereafter, as shown in FIGS. 15A to 15C, the sacrificial films 121 and 122 are recessed by a predetermined amount by isotropic etching from the side surfaces of the isolation trench 161 to form a space 162 for filling a floating gate electrode film and a space 162a for separating the selection transistors and the memory cells. As the etching, for example, alkali etching using an alkali solution can be used. Consequently, the sacrificial films 121 and 122 remain near the center in the second direction of the control gate electrode film 103a and the selection gate electrode film 106a divided by the isolation trench 161 formed at the predetermined interval in the second direction. The sacrificial films 121 and 122 support the control gate electrode films 103a and the selection gate electrode films 106a.

Subsequently, as shown in FIGS. 16A to 16C, the inter-electrode dielectric film 108 is formed over the entire surface of the semiconductor substrate 101. The inter-electrode dielectric film 108 is formed to conformally cover the stacked film in which the spaces 162 and 162a are formed. As the inter-electrode dielectric film 108, for example, an SiN—SiO—SiN—SiO—SiN stacked film (NONON film) having thickness of 14 nanometers formed by the LPCVD method, the plasma nitridation method, and the like can be used.

Further, the floating gate electrode film 109 is formed over the entire surface of the semiconductor substrate 101. As the floating gate electrode film 109, for example, a P-doped amorphous silicon film having thickness of 15 nanometers formed by the LPCVD method can be used. P density in forming the P-doped amorphous silicon film can be set to $1\times10^{20}$ to $5\times10^{20}$ $cm^{-3}$. Thereafter, the floating gate electrode film 109 is recessed to be left only in the space 162 by dry etching. As an etching gas for the etching, for example, a chlorine gas can be used.

When the inter-electrode dielectric film 108 is formed, because the sacrificial films 122 between the selection gate electrode films 106a and the control gate electrode films 103 in the top layer are thin compared with the sacrificial films 121, the space 162a between the selection gate electrode films 106a and the control gate electrode films 103 in the top layer is completely filled by the inter-electrode dielectric film 108. As a result, the floating gate electrode film 109 is not formed in the space 162a.

Subsequently, as shown in FIGS. 17A to 17C, the tunnel dielectric film 110 and the channel semiconductor film 111 are conformally formed over the entire surface of the semiconductor substrate 101. Consequently, the tunnel dielectric film 110 and the channel semiconductor film 111 are formed to cover the side surfaces and the bottom surface of the isolation trench 161. As the tunnel dielectric film 110, for example, a silicon oxide nitride film having thickness of 8 nanometers formed by the LPCVD method and the plasma nitridation method can be used. As the channel semiconductor film 111, for example, a P-doped amorphous silicon film having thickness of 15 nanometers formed by the ALD method can be used. P concentration in forming the P-doped amorphous silicon film can be set to $1\times10^{17}$ to $1\times10^{18}$ $cm^{-3}$. Consequently, the cross section of the channel semiconductor film 111 is parallel to the substrate surface on the stacked film and is formed in a U shape in the isolation trench 161.

Further, the gap-fill dielectric film 123 is formed on the semiconductor substrate 101 to fill the isolation trench 161 in which the tunnel dielectric film 110 and the channel semiconductor film 111 are formed. As the gap-fill dielectric film 123, for example, a silicon oxide film having thickness of 20 nanometers formed by the ALD method can be used.

Thereafter, impurities of a predetermined conduction type are implanted in sections of the channel semiconductor film 111 overlaid on the stacked film (the hard mask films 107) by the lithography technique and the ion implantation technique to form the impurity diffusion region 115. An N-type source/drain region can be formed in the channel semiconductor film 111 by, for example, ion-implanting As.

Subsequently, as shown in FIGS. 18A to 18C, a not-shown mask film is formed over the entire surface of the semiconductor substrate 101 and processed to arrange the NAND strings NS on the semiconductor substrate 101 in a matrix shape using the lithography technique and the RIE method. The NAND strings NS are separated by collectively processing the stacked film and forming a trench 163, which connects to the interlayer dielectric film 102, such that the NAND strings NS are arranged at a predetermined interval in the first direction in regions divided by the sacrificial films 121 and 122 arrayed in the second direction. The trench 163 only has to be capable of cutting at least the floating gate electrode films 109 and cutting the channel semiconductor films 111 of the NAND strings NS adjacent to each other in the first direction.

Consequently, the control gate electrode films 103a and the selection gate electrode films 106a are processed to include the common connecting section 1031 that extends in the first direction like the sacrificial films 121 and 122, and the electrode forming films 1032 formed for each of the memory cells to project in the second direction from the common connecting section 1031. The electrode forming sections 1032 are held between the upper and lower floating gate electrode films 109. The common connecting section 1031 connects, in common, the electrode forming sections 1032 at the same height of the NAND strings NS arrayed in the first direction.

By forming the trench 163, the channel semiconductor film 111 is aligned and formed without deviating from a forming position of the floating gate electrode film 109. The floating gate electrode film 109 is formed to be connected to the side surface of the channel semiconductor film 111 via the tunnel dielectric film 110 in advance. Therefore, when the trench 163 is formed, the U-shaped channel semiconductor film 111 can be formed in a self-aligning manner with respect to the floating gate electrode film 109. By the formation of the trench 163, memory cells of the floating gate type are collectively formed. As the mask film, a CVD carbon film can be used. After processing the trench 163, the mask film is removed.

Subsequently, as shown in FIGS. 19A to 19C, to remove damage during the collective processing, post oxidation by plasma oxidation is performed. Thereafter, the insulating film 124 is formed over the entire surface of the semiconductor substrate 101 using a film forming method with satisfactory step covering properties. As the insulating film 124, for example, a silicon oxide film formed by the ALD method can be used. Further, the interlayer dielectric film 125 is formed using a film forming method with poor step covering properties. Consequently, the interlayer dielectric film 125 is hardly filled in the trench 163. The interlayer dielectric film 125 is formed in an upper part of the stacked film to cover an upper part of the trench 163. Consequently, the air gap 163a is formed between the U-shaped NAND strings adjacent to each other in the first direction. By forming the air gap 163a, because parasitic capacitance between electrodes adjacent each other can be reduced, it is possible to realize improvement of operation speed. As the interlayer dielectric film 125, for example, a silicon oxide film formed by the plasma CVD method can be used.

Thereafter, a not-shown mask film is formed over the entire surface of the semiconductor substrate 101. The stacked film is collectively processed by the lithography technique and the RIE method to form the trench 164 that connects to the interlayer dielectric film 102 and extends in the first direction. The trench 164 is formed near the center in the second direction of the common connecting section 1031 that extends in the first direction of the control gate electrode film 103a. The trench 164 divides the control gate electrode film 103a in the second direction. Consequently, the channel semiconductor film 111 overlaid on the stacked film (the hard mask films 107) is also separated between the NAND strings adjacent to each other in the second direction. As the mask film, a CVD carbon film can be used. After the processing of the trench 164, the mask film is removed.

Subsequently, as shown in FIGS. 20A to 20C, the sacrificial films 121 and 122 are selectively recessed by etching to form the air gaps 165 between the selection gate electrode films 106a and the control gate electrode films 103a in the top layer and between the upper and lower control gate electrode films 103a. When amorphous silicon films are used as the sacrificial films 121 and 122, as the etching, for example, alkali etching using an alkali solution can be used. Thereafter, heat treatment at high temperature and in a short time such as rapid thermal annealing (RTA) treatment is performed to crystallize films formed of the amorphous silicon films. As a result, the control gate electrode films 103a, the selection gate electrode films 106a, the floating gate electrode films 109, and the channel semiconductor films 111 formed of the amorphous silicon films are crystallized.

Subsequently, as shown in FIGS. 21A to 21C, a not-shown metal film containing metal that reacts with silicon to form silicide is formed over the entire surface of the semiconductor substrate 101. As the metal film, for example, a cobalt film can be used. Thereafter, heat treatment is performed to cause the control gate electrode films 103a and the selection gate electrode films 106a exposed at the ends of the trench 164 and the metal film to react with each other to silicide the control gate electrode films 103a and the selection gate electrode films 106a. Consequently, silicided control gate electrode films 103 and selection gate electrode films 106 are obtained. When cobalt is used as the metal film, the control gate electrode film 103 and the selection gate electrode film 106 are formed of cobalt silicide. In this way, the control gate electrode films 103 and the selection gate electrode films 106 are changed to silicide films to have low resistance.

As a method of reducing the resistance of the control gate electrode films 103 and the selection gate electrode films 106, besides the above, it is also possible to use, for example, a method of forming a nickel film as the metal film with the CVD method and reducing resistance through silicidation or a method of replacing the B-doped amorphous silicon film forming the control gate electrode films 103a and the selection gate electrode films 106a with the CVD method using $WF_6$.

Thereafter, the interlayer dielectric film 126 is formed over the entire surface of the semiconductor substrate 101 using a film forming method with poor step coverage. Consequently, the interlayer dielectric film 126 is hardly filled in the trench 164. The interlayer dielectric film 126 is formed in an upper part of the stacked film to cover an upper part of the trench 164. Consequently, the air gap 164a is formed between the U-shaped NAND strings adjacent to each other in the second direction. By forming the air gap 164a, because parasitic capacitance between electrodes adjacent each other can be reduced, it is possible to realize improvement of operation speed. As the interlayer dielectric film 126, for example, a silicon oxide film formed by the plasma CVD method can be used.

Thereafter, after an interlayer dielectric film is further formed, formation of wires and contact plugs is performed. However, the wires and the contact plugs can be formed by a publicly-known method. Therefore, detailed explanation of the formation is omitted. The nonvolatile semiconductor memory device according to the second embodiment is obtained.

In the second embodiment, the air gaps 163a and 164a are provided between the NAND strings adjacent to each other in the first direction and the second direction. Consequently, because parasitic capacitance between memory cells adjacent to each other can be suppressed, there is an effect that writing, erasing, and readout operation speed can be enhanced.

In the second embodiment, the B-doped silicon films are used as the control gate electrode films 103a and the selection gate electrode films 106a, and the silicon films are used as the sacrificial films 121 and 122 to form the stacked film. The stacked film is collectively processed to form a three-dimensional nonvolatile semiconductor memory device. Because both the control gate electrode films 103a and selection gate electrode films 106a and the sacrificial films 121 and 122 are silicon films, there is an effect that processing is easy compared with the first embodiment.

Third Embodiment

Figure 22:
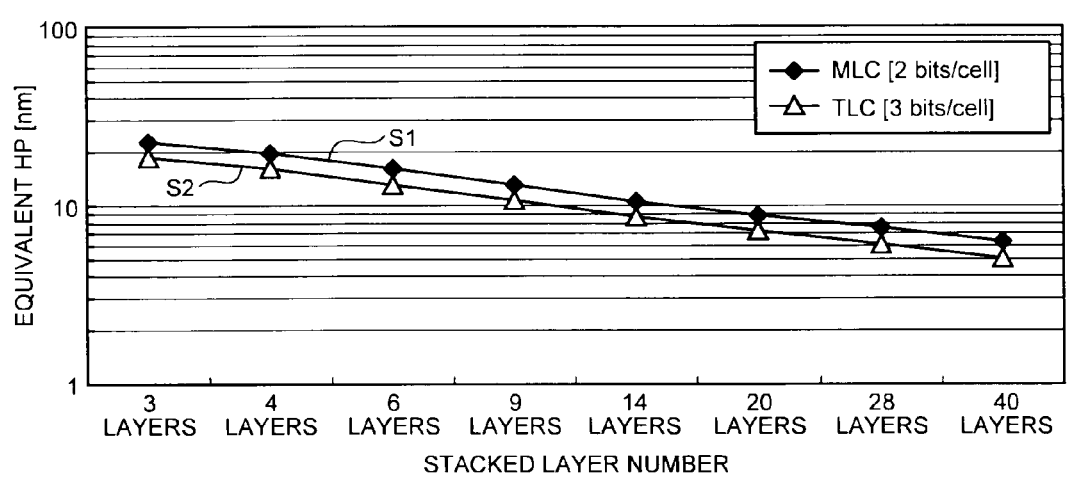
FIG. 22 is a diagram of a scaling scenario of the nonvolatile semiconductor memory devices according to the first and second embodiments.

FIG. 22 is a diagram of scaling scenarios of the nonvolatile semiconductor memory devices according to the first and second embodiments. In the figure, the abscissa indicates the number of stacked layers of memory cells and the ordinate indicates an equivalent half pitch (nm) in the case of a planar floating gate type structure. A curve S1 indicates a scaling scenario of a half pitch equivalent to MLC (2 bits/cell). A curve S2 indicates a scaling scenario of a half pitch equivalent to TLC (3 bits/cell).

As shown in the figure, in the nonvolatile semiconductor memory devices according to the first and second embodiments, it is possible to reduce an effective half pitch by increasing the number of stacked layers. When the MLC indicated by the curve S1 is used, it is seen that scaling in eight generations can be carried out simply by increasing the number of stacked layers when this structure is introduced from about a 20 nm generation at the half pitch. It is also seen that, in the floating gate type structure, further scaling is possible as indicated by the curve S2 by using TLC that can be relatively easily realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising sheet-like memory strings arranged in a matrix shape substantially perpendicularly to a substrate, wherein each of the memory strings includes, in a height direction of a sheet-like semiconductor film, a plurality of memory cells each including a tunnel dielectric film, a floating gate electrode film, an inter-electrode dielectric film, and a control gate electrode film on a first principal plane of the sheet-like semiconductor film, the control gate electrode film includes a common connecting section that connects the control gate electrode films of the memory cells at same height of the memory strings arranged in a first direction and extends in the first direction, and an electrode forming section that is provided for each of the memory cells above or below the floating gate electrode film via the inter-electrode dielectric film to project from the common connecting section in a second direction orthogonal to the first direction, the floating gate electrode film has a shape extending in the second direction and is formed on the first principal plane of the sheet-like semiconductor film via the tunnel dielectric film, and the memory cell has structure in which the floating gate electrode film is held, via the inter-electrode dielectric film, between the electrode forming sections of the upper and lower control gate electrode films.

2. The nonvolatile semiconductor memory device according to claim 1, wherein the memory string further includes, via a gate insulating film, a back gate electrode film on a second principal plane on an opposite side of the first principal plane of the sheet-like semiconductor film.

3. The nonvolatile semiconductor memory device according to claim 1, wherein air gaps are provided between the memory strings adjacent to each other in the first and second directions.

4. The nonvolatile semiconductor memory device according to claim 3, wherein the control gate electrode film is a silicide film.

* * * * *